(12) United States Patent
Aoyagi et al.

(10) Patent No.: US 9,627,347 B2
(45) Date of Patent: Apr. 18, 2017

(54) METHOD OF MANUFACTURING SEMICONDUCTOR DEVICE AND SEMICONDUCTOR DEVICE MANUFACTURING APPARATUS

(71) Applicant: National Institute of Advanced Industrial Science and Technology, Tokyo (JP)

(72) Inventors: Masahiro Aoyagi, Tsukuba (JP); Thanh Tung Bui, Tsukuba (JP); Motohiro Suzuki, Tsukuba (JP); Naoya Watanabe, Tsukuba (JP); Fumiki Kato, Tsukuba (JP); Lai Na Ma, Tsukuba (JP); Shunsuke Nemoto, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 14/428,635

(22) PCT Filed: Aug. 29, 2013

(86) PCT No.: PCT/JP2013/073205
§ 371 (c)(1),
(2) Date: Mar. 16, 2015

(87) PCT Pub. No.: WO2014/045828
PCT Pub. Date: Mar. 27, 2014

(65) Prior Publication Data
US 2015/0235984 A1   Aug. 20, 2015

(30) Foreign Application Priority Data

Sep. 24, 2012   (JP) .................................. 2012-210008

(51) Int. Cl.
*H01L 23/00* (2006.01)
*H01L 25/00* (2006.01)
*B23K 20/10* (2006.01)

(52) U.S. Cl.
CPC .............. *H01L 24/81* (2013.01); *B23K 20/10* (2013.01); *H01L 24/03* (2013.01); *H01L 24/11* (2013.01);
(Continued)

(58) Field of Classification Search
CPC ......... H01L 24/81; H01L 24/11; H01L 24/03; H01L 25/50; H01L 24/75;
(Continued)

(56) References Cited

U.S. PATENT DOCUMENTS 5,329,423 A * 7/1994 Scholz .................... H01L 23/32
174/263
7,557,452 B1 * 7/2009 Williams .......... H01L 23/49811
257/697

(Continued)

FOREIGN PATENT DOCUMENTS

JP         10-041611 A       2/1998
JP        2003-273160 A      9/2003

OTHER PUBLICATIONS

Patent Cooperation Treaty, International Search Report, International Patent Application No. PCT/JP2013/073205, Oct. 8, 2013, 3 Pages (with English translation).

*Primary Examiner* — Savitr Mulpuri
(74) *Attorney, Agent, or Firm* — Fenwick & West LLP

(57) ABSTRACT

A method of manufacturing a semiconductor device according to the present invention comprises:
a bump forming step of forming a bump electrode 100 on a semiconductor chip 1, the bump electrode 100 protruding in a substantially conical shape;
a pad forming step of forming a pad electrode 200 on a substrate 10, the pad electrode 200 having a recess 210 with inner lateral surfaces thereof defining a substantially pyramidal shape or a prism shape;
(Continued)

a pressing step of pressing the bump electrode 100 and the pad electrode 200 in a direction which brings them closer to each other, with the bump electrode 100 being inserted in the recess 210 so that the central axis of the bump electrode 100 and the central axis of the recess 210 coincide with each other; and an ultrasonic joining step of joining the bump electrode 100 and the pad electrode 200 by vibrating at least one of the bump electrode 100 and the pad electrode 200 using ultrasonic waves.

14 Claims, 23 Drawing Sheets

(52) U.S. Cl.
CPC .............. *H01L 24/75* (2013.01); *H01L 25/50* (2013.01); *H01L 2224/75343* (2013.01); *H01L 2224/81205* (2013.01); *H01L 2924/01029* (2013.01); *H01L 2924/01079* (2013.01); *H01L 2924/37001* (2013.01)

(58) Field of Classification Search
CPC . H01L 2224/81205; H01L 2924/01029; H01L 2924/01079; H01L 2924/37001; H01L 2224/75343; B23K 20/10
See application file for complete search history.

(56) References Cited

U.S. PATENT DOCUMENTS

| | | | | |
|---|---|---|---|---|
| 7,728,431 B2* | 6/2010 | Harada | ................... | H01L 24/03 257/750 |
| 2002/0171152 A1* | 11/2002 | Miyazaki | .............. | H01L 21/563 257/778 |
| 2005/0030125 A1* | 2/2005 | Nakano | ..................... | H03H 3/08 333/133 |
| 2007/0023483 A1* | 2/2007 | Yoneyama | ............. | B23K 20/10 228/110.1 |
| 2007/0284738 A1* | 12/2007 | Shimoishizaka | ... | H01L 21/4853 257/737 |
| 2008/0023829 A1* | 1/2008 | Kok | ........................ | H01L 24/81 257/737 |
| 2009/0103037 A1* | 4/2009 | Abe | ........................ | H05K 3/361 349/150 |
| 2009/0155955 A1* | 6/2009 | Liang | ....................... | H01L 21/56 438/108 |
| 2010/0102444 A1* | 4/2010 | Khor | ..................... | H01L 21/561 257/737 |
| 2010/0105173 A1* | 4/2010 | Fujimori | ................. | H01L 24/11 438/121 |
| 2010/0133671 A1* | 6/2010 | Tzu | ................... | H01L 23/49811 257/676 |
| 2011/0193223 A1* | 8/2011 | Ozaki | ..................... | H01L 24/05 257/737 |
| 2013/0057361 A1* | 3/2013 | Sakano | ............... | H01L 23/3121 333/193 |

* cited by examiner

Fig. 21
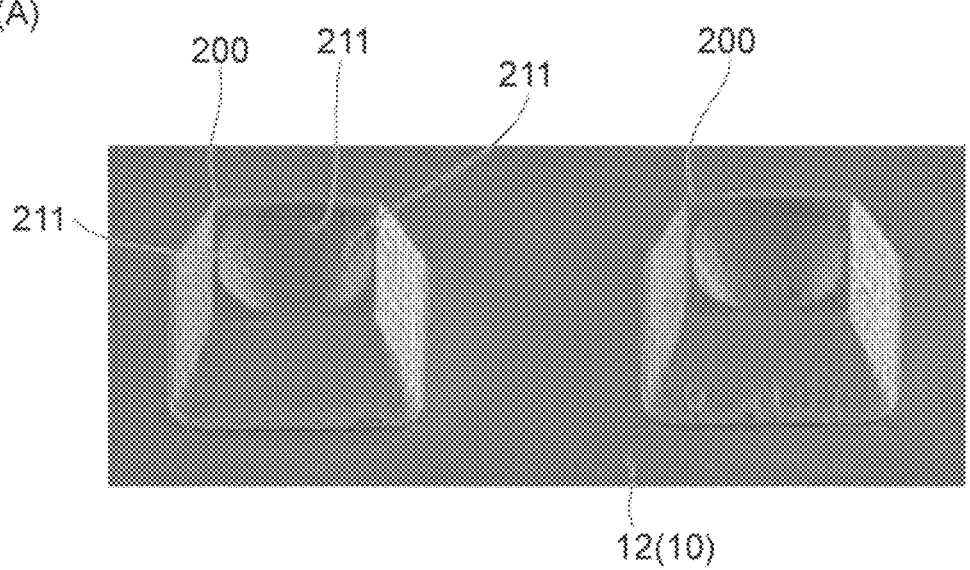
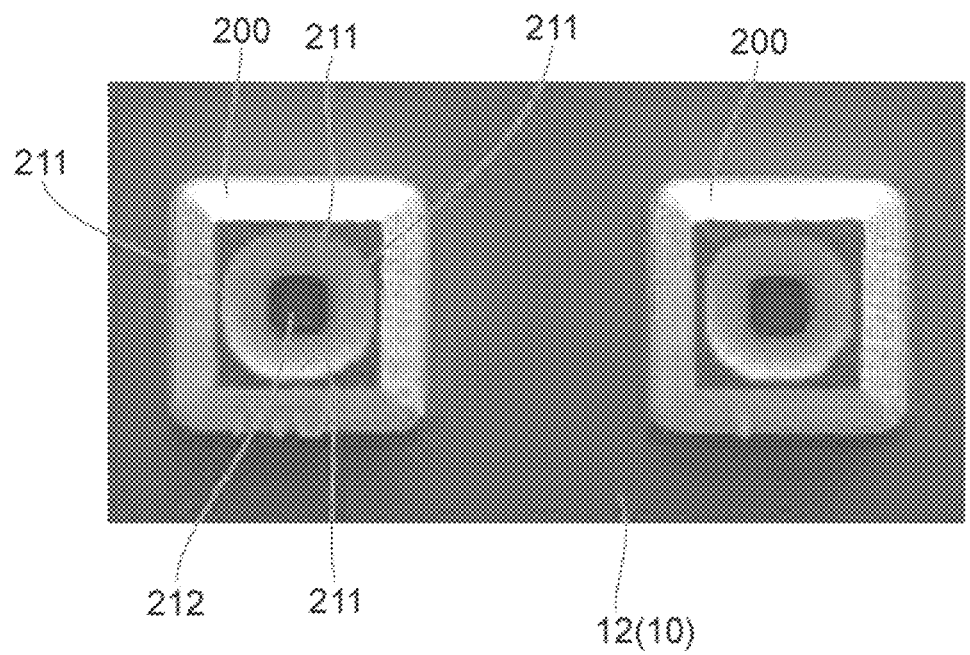

METHOD OF MANUFACTURING SEMICONDUCTOR DEVICE AND SEMICONDUCTOR DEVICE MANUFACTURING APPARATUS

TECHNICAL FIELD

The invention relates to a method of manufacturing a semiconductor device formed by connecting a semiconductor chip and a substrate or connecting semiconductor chips, and to a semiconductor manufacturing apparatus.

BACKGROUND ART

A structure in which a semiconductor chip is mounted face down onto a wiring board or onto another semiconductor chip and in which their electrodes are connected to each other via a bump electrode has been conventionally known as a connection structure between a semiconductor chip and a substrate or between semiconductor chips.

In semiconductor devices having such connection structure, efforts have been made in recent years to miniaturize the bump electrodes which are to be formed on a semiconductor chip, etc., and to reduce the chip pitch, in order to meet the needs for smaller and thinner mobile phones, etc. This has consequently created a necessity in which, when a semiconductor chip and a substrate, etc., are to be connected to each other, they have to be aligned with high accuracy in order to securely connect the corresponding bump electrodes thereof. For example, the width of bump electrodes that is predominantly employed these days is 10 μm or less, and the required accuracy of alignment is 1 μm or less.

In order to achieve a highly accurate alignment, Patent Document 1 describes forming a recess having an inner lateral surface defining a conical shape in one of the electrodes. In such configuration, even if the positions of this recess and the other electrode (bump electrode) are slightly out of alignment, the bump electrode can still be guided so as to be slid along the inner lateral surface of the recess during the process of bringing these electrodes closer to each other. As a result, the central axis of the bump electrode and the central axis of the recess can be easily caused to coincide with each other, thereby achieving a highly accurate alignment.

After performing the alignment, the electrodes have to be joined. Various methods of joining electrodes are known, examples of which include pressure welding, solder joining and ultrasonic joining. Of these joining methods, ultrasonic joining causes a small amount of stress on semiconductor chips, etc., with a relatively small load and relatively small temperature rise during joining, and it is therefore the most preferable method for compound semiconductor chips such as GaAs, InP, CdTe, ZnSe, AlGaAs, InGaAs, GaInNAs and for Si semiconductor chips fabricated to have a thin thickness of 20-100 μm.

RELATED ART DOCUMENT

Patent Document

Japanese laid-open patent application No. 2003-273160

SUMMARY OF THE INVENTION

Problem to be Solved by the Invention

In ultrasonic joining, since a semiconductor element to which ultrasonic waves are being applied vibrates relative to a substrate, etc., which is fixed by adsorption, the semiconductor element and the substrate, etc. vibrate in a direction in which they move relatively along the joint surfaces thereof. Accordingly, if ultrasonic joining is to be performed for the semiconductor chip and substrate, etc. that have been aligned by the method described in Patent Document 1, the bump electrode will jump out of the recess due to such vibration and misalignment may occur between the electrodes.

A possible way to prevent the occurrence of such misalignment would be to reduce the energy (amplitude, etc.) of ultrasonic vibration as compared to the conventional method. However, this reduction in the energy of ultrasonic vibration will lead to a reduction in the metal joining strength between the electrodes. In other words, the method described in Patent Document 1 can achieve a highly accurate alignment between the semiconductor chip and the substrate, etc., but this method has difficulty in achieving rigid joints in the subsequent ultrasonic joining.

The present invention has been made in view of such problem and the object of the present invention is to provide a method of manufacturing a semiconductor device and a semiconductor manufacturing apparatus that are capable of rigidly joining an electrode on a semiconductor chip and an electrode on a substrate, etc. at a relatively low temperature, while aligning these electrodes with a high degree of accuracy.

Means for Solving the Problem

In order to solve the problem above, a method of manufacturing a semiconductor device according to the present invention is a method of manufacturing a semiconductor device which is formed by connecting a semiconductor chip and a substrate or connecting semiconductor chips, the method comprising: a bump forming step of forming a first electrode on one semiconductor chip or substrate, the first electrode protruding in a substantially conical shape; a pad forming step of forming a second electrode on the other semiconductor chip or substrate, the second electrode having a recess with inner lateral surfaces thereof defining a substantially pyramidal shape or a prism shape; a pressing step of pressing the first electrode and the second electrode in a direction which brings them closer to each other, in the recess so that the central axis of the first electrode and the central ax with the first electrode being inserted is of the recess coincide with each other; and an ultrasonic joining step of joining the first electrode and the second electrode by vibrating at least one of the first electrode and the second electrode using ultrasonic waves.

The present invention also provides a semiconductor manufacturing apparatus which connects a semiconductor chip and a substrate or connects semiconductor chips by the above method.

The present invention also provides a semiconductor manufacturing apparatus which manufactures a semiconductor device formed by connecting a semiconductor chip and a substrate or connecting semiconductor chips, wherein: a first electrode is formed on one semiconductor chip or substrate, the first electrode protruding in a substantially conical shape; and a second electrode is formed on the other semiconductor chip or substrate, the second electrode having a recess with inner lateral surfaces thereof defining a substantially pyramidal shape or a prism shape, the semiconductor manufacturing apparatus comprising: a pressing apparatus that presses the first electrode and the second electrode in a direction which brings them closer to each other, with the first electrode being inserted in the recess in the second electrode so that the central axis of the first electrode and the central axis of the recess coincide with each other; and an ultrasonic apparatus that vibrates at least one of the first electrode and the second electrode using ultrasonic waves in order to join the first electrode and the second electrode.

BRIEF DESCRIPTION OF THE DRAWINGS

FIG. 21 shows photos showing the pad electrodes according to the sixth embodiment of the present invention.

BEST MODE FOR CARRYING OUT THE INVENTION

Figure 1:
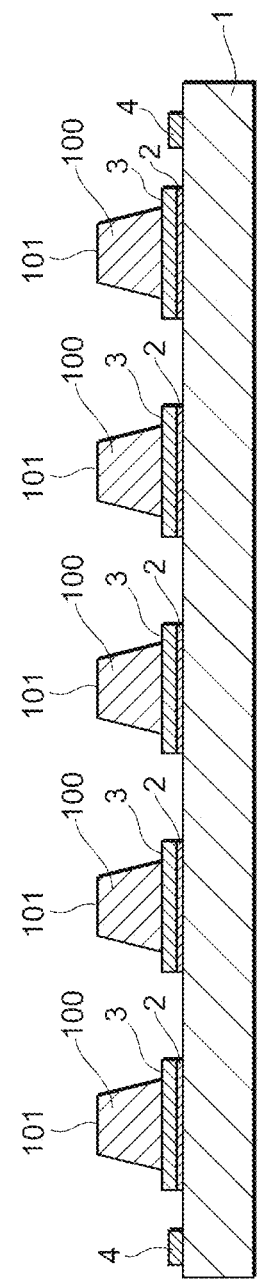
FIG. 1 is a cross-sectional view showing an example of a semiconductor chip on which bump electrodes have been formed by a bump electrode forming step according to a first embodiment of the present invention.

A method of manufacturing a semiconductor device according to one embodiment of the present invention comprises: a bump forming step of forming a first electrode on one semiconductor chip or substrate, the first electrode protruding in a substantially conical shape; a pad forming step of forming a second electrode on the other semiconductor chip or substrate, the second electrode having a recess with inner lateral surfaces thereof defining a substantially pyramidal shape or a prism shape; a pressing step of pressing the first electrode and second electrode in a direction which brings them closer to each other, with the first electrode being inserted in the recess so that the central axis of the first electrode and the central axis of the recess coincide with each other; and an ultrasonic joining step of joining the first electrode and the second electrode by vibrating at least one of the first electrode and the second electrode using ultrasonic waves.

The first electrode that is formed on one semiconductor chip or substrate so as to protrude in a substantially conical shape in the above bump forming step constitutes a so-called bump electrode (or a protruding electrode). The second electrode that is formed on the other semiconductor chip or substrate so as to have a recess with inner lateral surfaces thereof defining a substantially pyramidal shape or a prism shape in the pad forming step constitutes a so-called pad electrode that is to be joined with the bump electrode.

In the subsequent pressing step, the first electrode and the second electrode are pressed in the direction which brings them closer to each other, with the first electrode being inserted in the recess in the second electrode (or, in other words, with the first electrode being covered with the recess in the second electrode). During the process of bringing the first electrode and second electrode closer to each other, the first electrode is guided so as to be slid along the inner lateral surfaces of the recess in the second electrode and this consequently creates a state in which the central axis of the first electrode and the central axis of the recess, i.e., the central axis of the second electrode, coincide with each other. Since a lateral surface of the first electrode, i.e., a lateral surface of the conical shape, and the inner lateral surfaces of the recess in the second electrode, i.e., the inner lateral surfaces defining the substantially pyramidal shape or the prism shape, have shapes different from each other, they do not contact with each other across their entire surfaces, but rather, contact at a plurality of lines or points.

The first electrode and the second electrode are brought into a state in which the central axes thereof coincide with each other and their lateral surfaces at least partially contact with each other due to the pressing step. The first electrode and the second electrode in this state are joined with each other in the subsequent ultrasonic joining step in which at least one of the first electrode and the second electrode are vibrated using ultrasonic waves. In this process, relatively large force is applied to the contacting portions between the first electrode and the second electrode due to the ultrasonic vibration. Superficial layers at these contacting portions of the two electrodes are slightly broken by such force and new active surfaces are exposed.

As a result, the first electrode and the second electrode contact with each other again via the active surfaces to form a rigid metallic bond therebetween. Then, the metallic bond expands from this portion as a starting point and the metallic bond is finally formed across the entire contacting surface between the first electrode and the second electrode.

In the present invention, the initial contacting portions between the first electrode and the second electrode are very narrow portions, such as lines or points, as mentioned above. Thus, even if the energy of the ultrasonic vibration is small, the energy can still be applied in a focused manner onto such contacting portions, and these portions serve as a starting point for the rigid metallic bond in the initial stage of the ultrasonic step. Consequently, it is possible to rigidly bond the first electrode and the second electrode while the energy of the ultrasonic vibration is set low enough to prevent the first electrode from jumping out of the recess in the second electrode.

In one embodiment, for example, a first flat surface is formed at a tip end of the first electrode, and a first angle formed by the lateral surface of the first electrode with respect to the central axis of the first electrode is smaller than a second angle formed by the inner lateral surface of the recess in the second electrode with respect to the central axis of the recess.

In other words, the first electrode having the first flat surface on the tip end of its substantially conical shape is formed such that the first angle formed by the lateral surface of the first electrode with respect to the central axis of the first electrode is smaller than the second angle formed by the inner lateral surface of the recess in the opposing second electrode with respect to the central axis of the recess.

With such configuration, the first electrode is first brought into contact with the recess in the second electrode at the outer circumference of the first flat surface formed on the tip end of the first electrode in the pressing step. Thus, in the subsequent ultrasonic joining step, the metallic bond between the first electrode and the second electrode proceeds from the tip end toward the rood of the first electrode, i.e., from a bottom side toward an opening side of the recess in the second electrode. As a result, air bubbles trapped in between the first electrode and the second electrode can be prevented from interfering with the formation of a metallic bond surface, thereby allowing the metallic bond to be formed across the entire contacting surface between the first electrode and the second electrode.

In one embodiment, for example, a second flat surface is formed at the bottom of the second electrode.

Thus, even if the first electrode is formed so as to have a low height, a large gap can be prevented from being formed between the first flat surface at the tip end of the first electrode and the second flat surface at the bottom of the recess in the second electrode.

In one embodiment, for example, the diameter of a circle inscribed with a circumference of the second flat surface is smaller than the diameter of the circumference of the first flat surface.

In the pressing step, if the entire first flat surface at the tip end of the first electrode abuts onto the second flat surface, the positional relationship between the central axis of the first electrode and the central axis of the recess in the second electrode is not completely restricted. As a result, slight misalignment may occur in the positional relationship at the point in time when the ultrasonic joining step is completed.

By forming the diameter of the circle inscribed with the circumference of the second flat surface so as to be smaller than the diameter of the circumference of the first flat surface, when the first electrode and the second electrode are brought closer to each other in the pressing step, the circumference of the first flat surface (i.e., apices) is brought into point contact with the inner lateral surface of the recess in the second electrode before the entire first flat surface at the tip end of the first electrode abuts onto the second flat surface in the recess of the second electrode. Thus, the process can proceed to the ultrasonic joining step with the positional relationship between the central axis of the first electrode and the central axis of the second electrode being completely restricted. As a result, the accuracy in the alignment between the electrodes can be further improved.

In one embodiment, for example, at least surfaces of the first electrode and the second electrode are formed of gold.

Since gold is a relatively soft metal, it will easily be broken at the contacting portions between the first electrode and the second electrode and new active surfaces will easily be exposed in the ultrasonic step. Thus, the first electrode and the second electrode can be joined even more securely. It should be noted that at least portions contacting with each other in the first electrode and the second electrode are preferably formed of gold.

In one embodiment, for example, the circumference of the tip end of the first electrode is chamfered.

For example, if the first flat surface is formed at the tip end of the first electrode and the circumference of the first flat surface is not chamfered, the circumference will be crushed relatively significantly in the pressing step and the ultrasonic joining step. As a result, a portion of the crushed first electrode may extend out of the recess in the second electrode and contact with an adjacent first electrode (or an adjacent second electrode) on the semiconductor chip. In other words, electricity will be conducted through the adjacent electrodes, which may cause damage in or malfunctioning of the semiconductor chip. Such contact is more likely to occur particularly in a fine-pitch semiconductor chip in which the distance between electrodes is short.

Accordingly, in this embodiment, the circumference of the tip end of the first electrode is chamfered. Such configuration can suppress the tip end of the electrode from being significantly crushed in the pressing step and the ultrasonic joining step. This will consequently suppress the crushed first electrode from extending out of the recess in the second electrode. It is therefore possible to perform joining for a semiconductor chip while ensuring the prevention of the electric conduction between the adjacent electrodes, even if the semiconductor chip is a fine-pitch chip.

In one embodiment, for example, the second electrode formed in the pad forming step is formed so as to entirely protrude from a flat surface of the semiconductor chip or substrate.

A possible specific method for forming the second electrode would be, for example, forming a recess by etching the surface of the substrate and forming an insulating layer and a conductive layer on the surface. Such method can be easily performed if the material of the substrate, etc. is silicon. However, if the material of the substrate, etc. is not silicon, it is not typically easy to directly form a recess in the surface of the substrate, etc.

Accordingly, in this embodiment, the second electrode is formed so as to entirely protrude from the flat surface of the semiconductor chip or substrate.

With such configuration, the second electrode can be formed on the surface of the substrate or semiconductor chip without forming a recess in the substrate or semiconductor chip itself; in other words, with the shape of the surface of the substrate or semiconductor ship being kept flat. Accordingly, if the material of the substrate, etc. is not silicon, the electrode of a semiconductor chip and the electrode of a substrate, etc. can be rigidly joined to each other using the method according to the present invention.

As described above, the present invention can provide a method of manufacturing a semiconductor device and a semiconductor manufacturing apparatus that are capable of rigidly joining an electrode of a semiconductor chip and an electrode of a substrate, etc. at a relatively low temperature, while making a highly accurate alignment therebetween.

The following description will describe more specific embodiments of the present invention with reference to the attached drawings. In order to aid the ease of understanding of the description, like components will be denoted by like reference symbols to the extent possible and redundant descriptions will be omitted.

The following description will describe an example in which a semiconductor chip and a substrate, each provided with electrodes, are connected to each other as an embodiment of a method of manufacturing a semiconductor device according to the present invention. It should be noted that the present invention is not limited to the method of manufacturing a semiconductor device formed by connecting the semiconductor chip and the substrate as will be described below, but is also applicable to a method of manufacturing a semiconductor device formed by connecting semiconductor chips.

FIG. 1 is a cross-sectional view showing an example of a semiconductor chip 1 on which a plurality of bump electrodes 100 has been formed by a bump forming step according to a first embodiment of the present invention. As shown in FIG. 1, the semiconductor chip 1 is a plate-like body made of silicon and having the plurality of bump electrodes 100 on one surface side thereof. The semiconductor chip 1 is an individual chip (a so-called "bare chip") cut out from a wafer on which semiconductor devices have been formed and the semiconductor chip 1 will be mounted on a substrate 10 with their electrodes joined with each other, as will be described later.

(Bump Forming Step)

The step of forming the bump electrodes 100 will be simply described below. An insulating layer 2 of $SiO_2$ is formed on one surface (the top surface in FIG. 1) of the semiconductor chip 1. The insulating layer 2 can be formed by PVD or CVD. The insulating layer 2 is patterned using a photo resist film in accordance with the arrangement of a metal layer 3 to be formed on the semiconductor chip 1.

The metal layer 3 is a layer formed so as to cover the insulating layer 2 and formed by depositing metal mainly consisting of gold. After the insulating layer 2 is formed, the metal layer 3 is deposited on the top of the insulating layer 2 before removing the photo resist film. Then, by removing the photo resist film, the insulating layer 2 and the metal layer 3 are patterned simultaneously.

Figure 3:
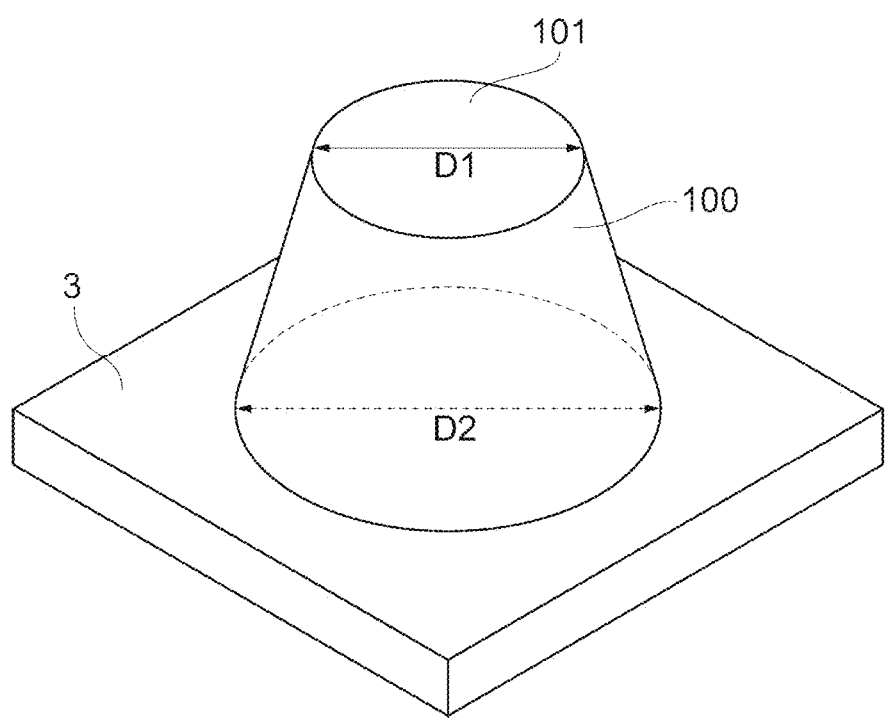
FIG. 3 is a perspective view showing a bump electrode shown in FIG. 1 in an enlarged manner.

After the insulating layer 2 and the metal layer 3 are formed, the plurality of bump electrodes 100 is formed so as to protrude from part of the metal layer 3. The bump electrode 100 protrudes in a substantially conical shape from the metal layer 3 as shown in FIG. 3 and the tip end of the bump electrode 100 is provided with a flat surface 101. The flat surface 101 is substantially parallel to the metal layer 3 and the diameter D1 of the flat surface 101 is smaller than the diameter D2 of the other end of the bump electrode 100, i.e. the portion contacting the metal layer 3.

In order to form the bump electrode 100 having the shape as shown in FIGS. 1 and 3, first, a photo resist film is formed on a surface, on which the metal layer 3 has been formed, of the semiconductor chip 1. The thickness of the photo resist film is substantially the same as the height of the bump electrodes 100 (to be formed). Then, holes having the diameter D2 are formed by etching at a plurality of positions, corresponding to the bump electrodes 100, in the photo resist film.

Next, gold is deposited on the photo resist film by PVD. During this process of deposition, the bump electrodes 100 each having the substantially conical shape with a flat tip end are growing inside the respective holes formed in the photo resist film. The deposition is terminated when the thickness of the gold becomes substantially the same as the thickness of the photo resist film and then, by removing the photo resist film, the bump electrodes 100 as shown in FIGS. 1 and 3 are formed.

It should be noted that the entire bump electrode 100 is formed of gold in the present embodiment. Alternatively, the bump electrode 100 having the substantially conical shape may be formed of copper, instead of gold, and then gold coating may be applied to the entire surface thereof. The present invention can particularly exert its advantageous effects if at least the superficial layer of the bump electrode 100 is formed of a relatively soft metal such as gold.

Figure 2:
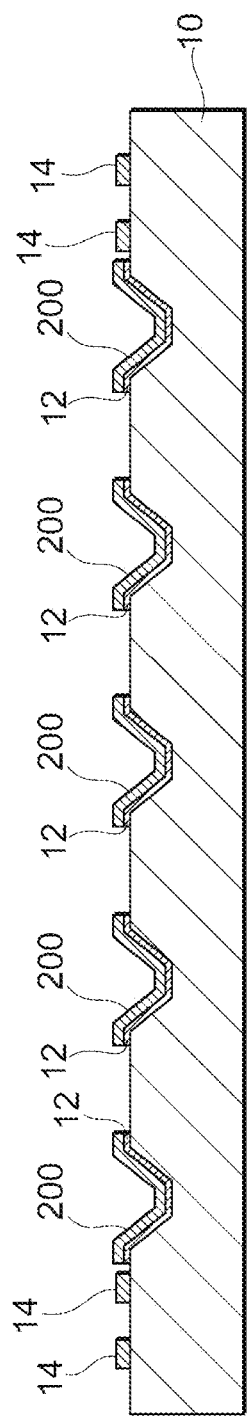
FIG. 2 is a cross-sectional view showing an example of a substrate on which pad electrodes have been formed by a pad electrode forming step of the present invention.

FIG. 2 is a cross-sectional view showing an example of the substrate 10 on which a plurality of pad electrodes 200 has been formed by a pad forming step of the present invention. As shown in FIG. 2, the substrate 10 is a plate-like body made of silicon as shown in FIG. 2 and has the plurality of pad electrodes 200 on one surface side thereof. These pad electrodes 200 are formed at positions corresponding to the bump electrodes 100 with the substrate 10 being connected to the semiconductor chip 1.

(Pad Forming Step)

The step of forming the pad electrodes 200 will be simply described below. First, a masking is applied on one surface (the top surface in FIG. 2) of the substrate 10 and rectangular holes are formed at positions in the masking where the pad electrodes 200 are to be formed. In other words, the portions in the substrate 10 where the pad electrodes 200 are to be formed are exposed.

In this state, etching is performed for the exposed portions. The etching forms recesses in the exposed portions. In this process, inner lateral surfaces of each recess are not perpendicular to the surface of the substrate 10, i.e., the masked surface, but are tilted downward toward the center of the recess, due to the anisotropy of silicon crystals. More specifically, the inner surface of the recess defines a substantially four-sided pyramidal shape having a flat bottom.

The recess grows deeper with the size of its flat bottom surface decreasing as the etching time advances. Then, the etching is terminated when the depth of the recess reaches a predetermined depth that is smaller than the height of the bump electrode 100 and the masking is then removed. At this time as well, the flat surface is formed at the bottom of the recess.

Next, an insulating layer 12 and the pad electrode 200 are formed so as to cover the entire inner surface of the recess and a portion near the recess in the surface of the substrate 10. The insulating layer 12, as the insulating layer 2 formed on the semiconductor chip 1, is a layer of $SiO_2$. The pad electrode 200 is a layer formed so as to cover the insulating layer 2 and is formed by depositing gold by PVD. The methods of forming the insulating layer 12 and the pad electrode 200 are the same as the above-described methods of forming the insulating layer 2 and the metal layer 3, respectively and the descriptions thereof will therefore be omitted.

It should be noted that the entire pad electrode 200 is formed of gold in the present embodiment. Alternatively, the pad electrode 200 may be formed of copper, instead of gold, and then gold coating may be applied to the entire surface thereof. The present invention can particularly exert its advantageous effects if at least the superficial layer of the pad electrode 200 is formed of a relatively soft metal such as gold.

Figure 4:
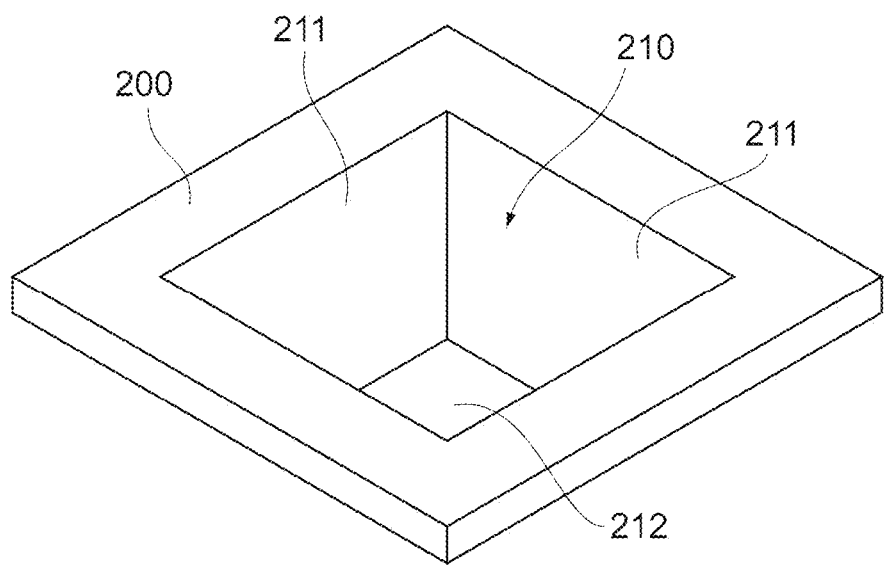
FIG. 4 is a perspective view showing a pad electrode shown in FIG. 2 in an enlarged manner.

As shown in FIG. 4, the pad electrode 200 formed on the substrate 10 by the steps set forth above has a substantially four-sided pyramidal shape as a whole with a flat bottom (which can also be referred as a top) and has, inside thereof, a recess 210 having substantially the same shape. Specifically, four inner lateral surfaces 211 of the recess 210 are tilted downward toward the center of the recess and a flat surface 212 is formed at the bottom. The flat surface 212 is a square planar surface and the length of one side thereof is smaller than the diameter D1 of the tip end of the bump electrode 100. As a result, the diameter of a circle inscribed with the circumference of the flat surface 212 is smaller than the diameter D1 of the circumference of the flat surface 101.

Next, a method of joining the bump electrodes 100 on the semiconductor chip 1 and the pad electrodes 200 on the substrate 10 will be described with reference to FIGS. 5-7. This joining is performed using a semiconductor manufacturing apparatus (a joining apparatus BE) that includes a stage 500 and a pickup apparatus 600. The joining apparatus BE is schematically depicted in FIG. 5.

Figure 5:
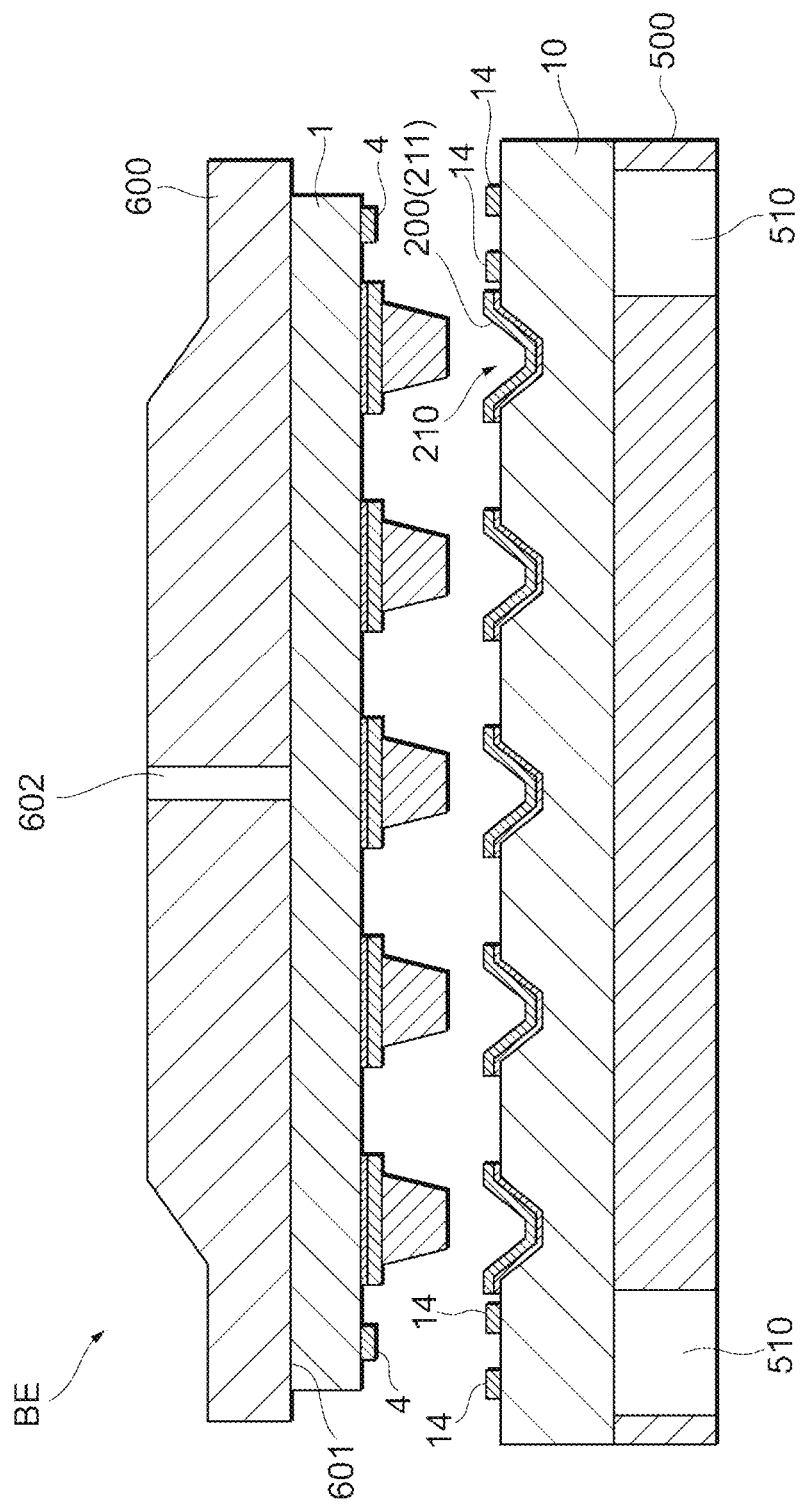
FIG. 5 is a cross-sectional view illustrating a method of manufacturing a semiconductor device according to an embodiment of the present invention.

As shown in FIG. 5, first, the substrate 10 is loaded on the stage 500. At this time, the substrate 10 is placed with the surface provided with the pad electrodes 200 facing upward and with the lower surface thereof being fixed by vacuum adsorption to the stage 500.

Next, the semiconductor chip 1 is held by the pickup apparatus 600. The pickup apparatus 600 has a flat holding surface 601. The pickup apparatus 600 causes the holding surface 601 to abut onto a surface opposite to the surface provided with the bump electrodes 100 of the semiconductor chip 1 to hold and fix the semiconductor chip 1 by vacuum adsorption. An adsorption hole 602 is formed substantially at the center of the holding surface 601 and the air existing between the holding surface 601 and the semiconductor chip 1 is evacuated through the adsorption hole 602, so that the semiconductor chip 1 can be fixed by vacuum adsorption. As shown in FIG. 5, the pickup apparatus 600 moves the semiconductor chip 1 to above the stage 500 so as to cause the semiconductor chip 1 to face the substrate 10 parallel to each other.

The pickup apparatus 600 further adjusts the position of the semiconductor chip 1 so that the positions of all the bump electrodes 100 formed on the semiconductor chip 1 are located directly above the (corresponding) pad electrodes 200 formed on the substrate 10.

It should be noted that alignment marks 4 and 14 are formed on the semiconductor chip 1 and the substrate 10, respectively. The stage 500 is provided with a window 510 below the alignment mark 14 of the substrate 10, so that, by emitting an infrared ray through the window, the positional relationship between the alignment mark 4 and the alignment mark 14 can be checked by a camera (not shown). If the stage 500 is formed of a material transparent to the infrared ray (e.g., glass), the window 510 does not have to be formed.

The pickup apparatus 600 finely adjusts the position of the semiconductor 1 it holds based on information related to the positional relationship between the alignment marks 4 and 14 obtained from the camera. This adjustment does not have to be necessarily performed until the central axes of the bump electrodes 100 and the central axes of the recesses 210 completely coincide with each other but may be terminated when the misalignment between these central axes becomes within about 2 µm.

Misalignment between the central axes may be allowable if the flat surface 101 on the tip end of the bump electrode 100 can be securely inserted into the recess 210 when the pickup apparatus 600 is descended along a direction perpendicular to the holding surface 601. In other words, the misalignment may be allowable if the first contact between the bump electrode 100 and the pad electrode 200 securely occurs between the outer circumference of the flat surface 101 and the inner lateral surfaces 211.

After the alignment is completed, the pickup apparatus 600 is descended along the direction perpendicular to the holding surface 601, while maintaining the state in which the semiconductor chip 1 and the substrate 10 are parallel to each other. After the tip end of the bump electrode 100 is inserted into the recess 210, the outer circumference of the flat surface 101 is brought into contact with the inner lateral surfaces 211 of the recess 210. At this time, if the central axis of the bump electrode 100 and the central axis of the recess 210 completely coincide with each other, the outer circumference of the circular flat surface 101 contacts simultaneously at four points with the four inner lateral surfaces 211. However, if there is a misalignment between the central axes, the outer circumference of the flat surface 101 first contacts with one of the inner lateral surfaces 211.

(Pressing Step)

Next, a pressure is applied so as to further descend the pickup apparatus 600. The outer circumference of the flat surface 101 receives reaction force from the inner lateral surfaces 211 in contact (i.e., force in the directions normal to the inner lateral surfaces 211). This reaction force causes the semiconductor chip 1 to move parallel to the direction in which the central axis of the bump electrode 100 and the central axis of the recess 210 coincide with each other. The semiconductor chip 1 is further descended along with this parallel movement and, finally, the outer circumference of the flat surface 101 is brought into point contact with the fourth inner lateral surfaces 211 (this point contact may be "line contact" or "plane contact" in a minute area, considering that the bump electrode 100 may have distortion or the like; the same applies to the following description) (FIG. 6). At this time, the central axis of the bump electrode 100 and the central axis of the recess 210 completely coincide with each other.

Figure 6:
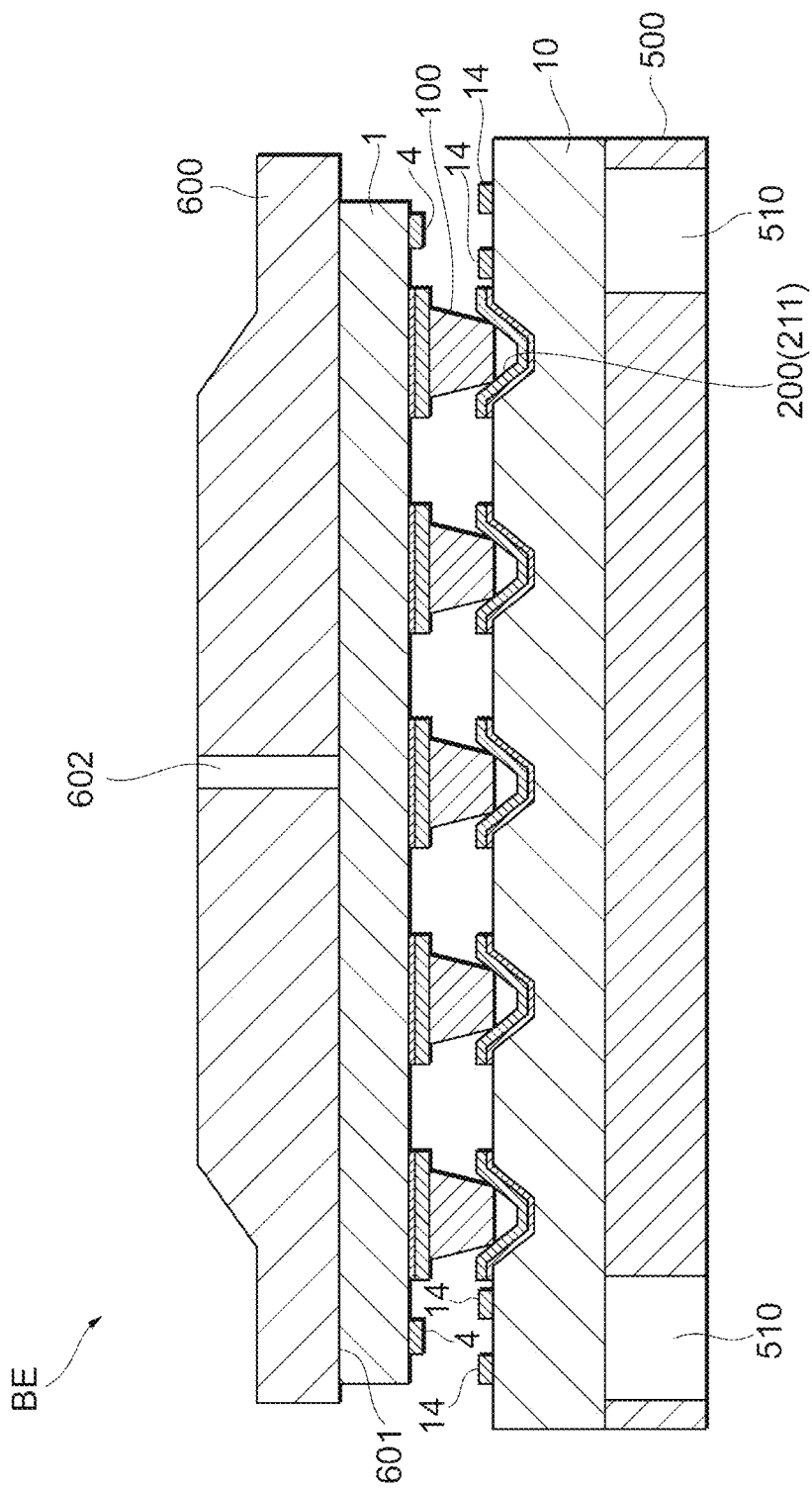
FIG. 6 is a cross-sectional view illustrating the method of manufacturing the semiconductor device according to an embodiment of the present invention.
Figure 7:
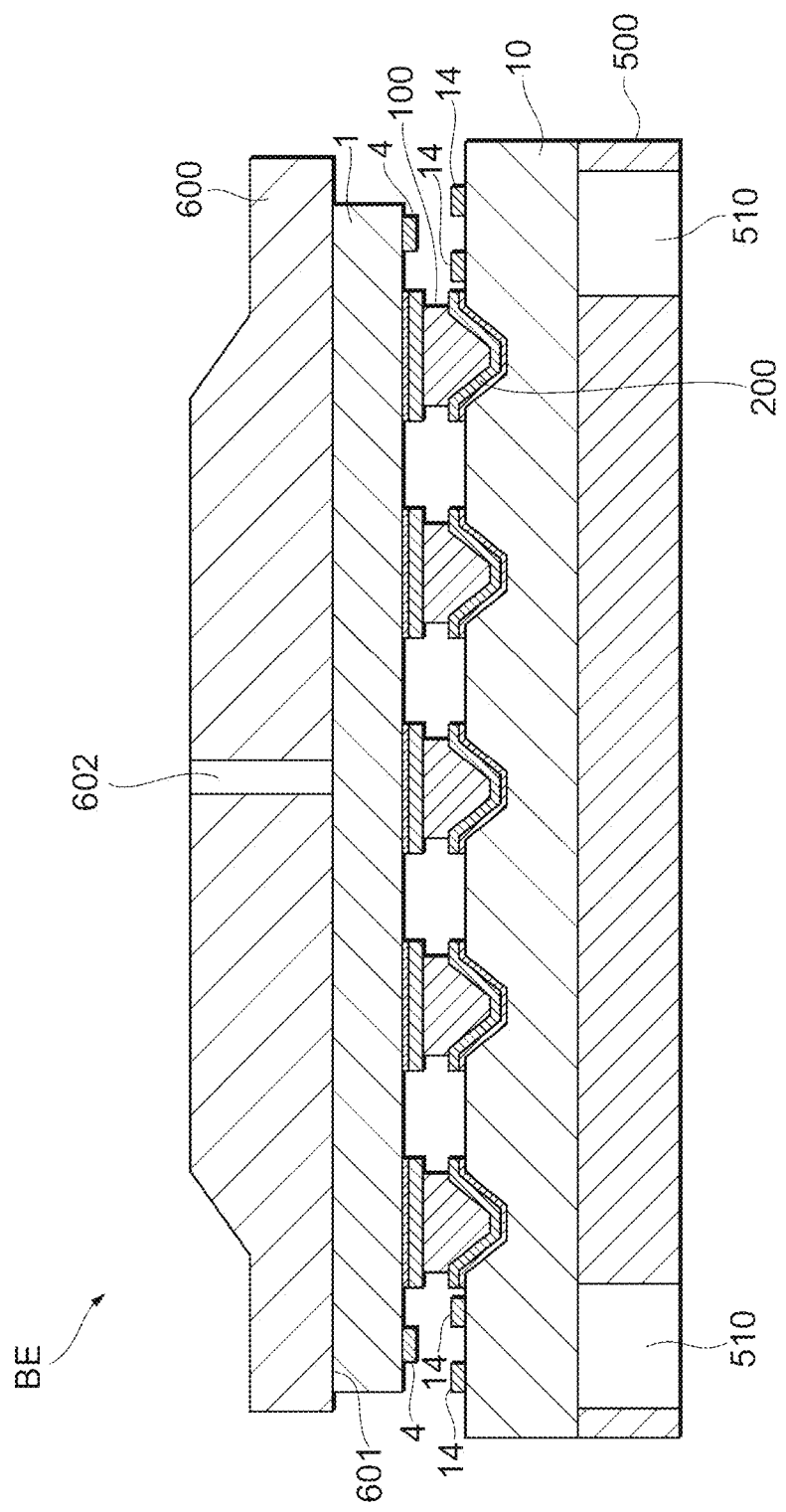
FIG. 7 is a cross-sectional view illustrating the method of manufacturing the semiconductor device according to an embodiment of the present invention.

Even in the state shown in FIG. 6 where the pickup apparatus 600 and the semiconductor chip 1 have been descended, the pickup apparatus 600 continuously presses the semiconductor chip 1 downward with force of a predetermined magnitude.

(Ultrasonic Joining Step)

Ultrasonic vibration is applied to the pickup apparatus 600 from the outside thereof while the bump electrode 100 and the pad electrode 200 are continuously pressed in the direction which brings them closer to each other. Such application of ultrasonic vibration causes the pickup apparatus 600 to vibrate along a direction parallel to the holding surface 601 (the horizontal direction).

At this time, since the bump electrode 100 and the pad electrode 200 are in point contact at four points as described above, a relatively large amount of force is applied to the contacting portions due to the ultrasonic vibration. The superficial layers in the contacting portions, i.e., the superficial layer of the bump electrode 100 and the superficial layer of the pad electrode 200, are slightly broken due to this force, and new active surfaces are exposed.

As a result, the bump electrode 100 and the pad electrode 200 are again brought into contact with each other at their active surfaces and a rigid metallic bond is formed therebetween. Then, the metallic bond expands, starting from these four point contact portions and the metallic bond is finally formed across the entire contacting surface between the bump electrode 100 and the pad electrode 200 (FIG. 7).

In the method of manufacturing a semiconductor device according to the present embodiment, the initial contacting portions between the bump electrode 100 and the pad electrode 200 at a point in time in the pressing step shown in FIG. 6 (i.e., before starting the ultrasonic vibration) is quite narrow, as described above. Thus, in the ultrasonic vibration step, even a small amount of energy of the ultrasonic vibration can be focused on such contacting portions and the contacting portions serve as starting points for the rigid metallic bond.

As a result, the bump electrode 100 and the pad electrode 200 can be rigidly joined while reducing the energy of ultrasonic vibration so as to be small enough to prevent the bump electrode 100 from jumping out of the recess 210 in the pad electrode 200. In other words, the method of manufacturing the semiconductor device according to the present embodiment can allow the bump electrode 100 to be inserted into the recess 210 and allow the bump electrode 100 and the pad electrode 200 to be rigidly joined while maintaining a highly accurate alignment therebetween.

When ultrasonic joining is performed, objects to be joined are typically heated. However, in the present embodiment, rigid joining could be performed at, for example, room temperature, without performing any particular heating. It is presumed that the advantageous effects of the present invention, i.e., the exposure of active surfaces and the rigid metallic bond between these surfaces, could be significantly exerted by forming both the bump electrodes 100 and the pad electrodes 200 of gold.

It should be noted that, as another embodiment of the present invention, copper may be used instead of gold as a material for the bump electrodes 100, etc. For example, the entire bump electrode 100, etc. may be formed of copper or only a surface of the bump electrode 100, etc. may be formed of copper. In such case, in order to join the bump electrodes 100 and the pad electrodes 200 rigidly, they have to be heated in the ultrasonic vibration step. However, as compared to heating to 400° C., which is normally conducted when the ultrasonic step is not performed, rigid joining can be achieved at a much lower temperature of, for example, 120-150° C.

Figure 8:
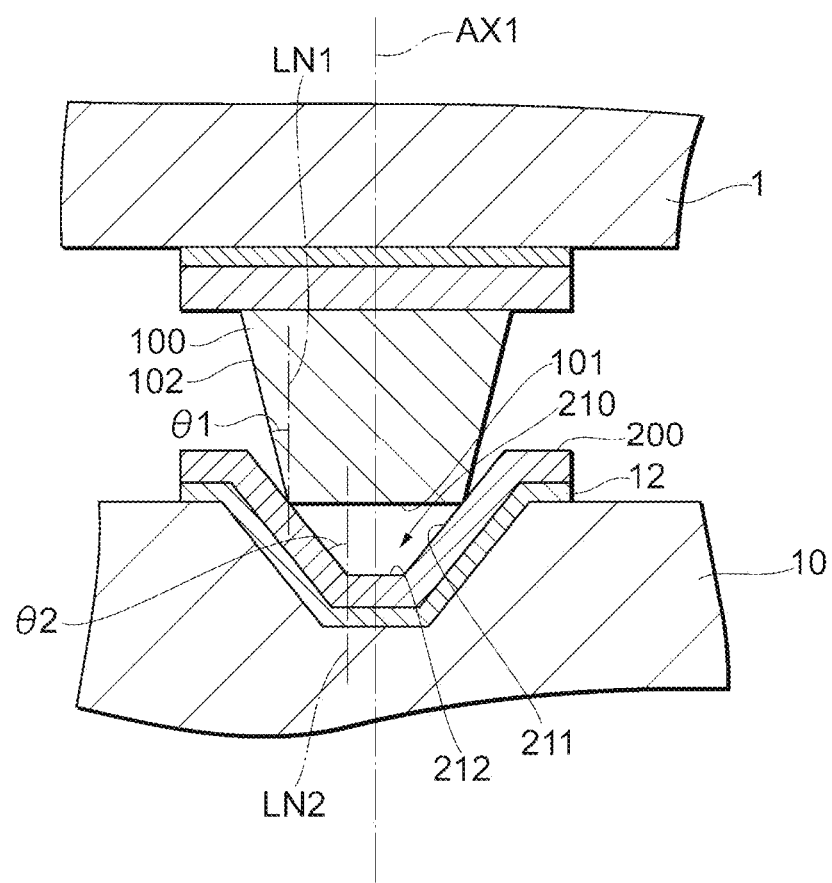
FIG. 8 is a cross-sectional view showing part of the view in FIG. 6 in an enlarged manner.

The shapes of the bump electrodes 100 and the pad electrodes 200 in the present embodiment will now be further described with reference to FIG. 8. FIG. 8 is a cross-sectional view showing part of the view in FIG. 6 in an enlarged manner, which shows a state in which the bump electrode 100 and the pad electrode 200 are at least partially in contact with each other in the pressing step.

Assuming that the angle formed by the lateral surface 102 of the bump electrode 100 with respect to the central axis AX1 of the bump electrode 100 is a tilt angle $\theta 1$ and that the angle formed by the inner lateral surface 211 of the recess 210 with respect to the central axis (which coincides with AX1 in FIG. 8) of the recess 210 is a tilt angle $\theta 2$, as shown in FIG. 8, the angle $\theta 1$ is smaller than the angle $\theta 2$. It should be noted that the dashed lines LN1 and LN2 in FIG. 8 are both straight lines parallel to the central axis AX1.

By forming the bump electrode 100 in such a shape, the outer circumference of the flat surface 101 on the tip end of the bump electrode 100 is in contact with the inner lateral surfaces 211 of the recess 210 in the pressing step. Thus, in the subsequent ultrasonic joining step, the metallic bond between the bump electrode 100 and the pad electrode 200 can proceed from the tip end toward the root of the bump electrode 100, i.e., toward the portion in contact with the metal layer 3; in other words, it proceeds from the bottom flat surface 121 side toward the opening end side of the recess 210 of the bump electrode 200. As a result, air bubbles trapped in between the bump electrode 100 and the pad electrode 200 can be prevented from interfering with the formation of the metallic bond, allowing the metallic bond to be formed therebetween in a wide area.

In the present embodiment, the flat surface 212 is formed at the bottom of the recess 210 of the pad electrode 200, as shown in FIG. 8. Thus, a wide space is prevented from being formed between the flat surface 101 at the tip end of the bump electrode 100 and the flat surface 212 at the bottom of the recess 210 even if the bump electrode 100 is not formed so as to be high. In addition, the time required for the pad forming step is shortened as compared to a configuration in which the inner surface of the recess 210 define a complete four-sided pyramid shape without the flat surface 212.

Figure 9:
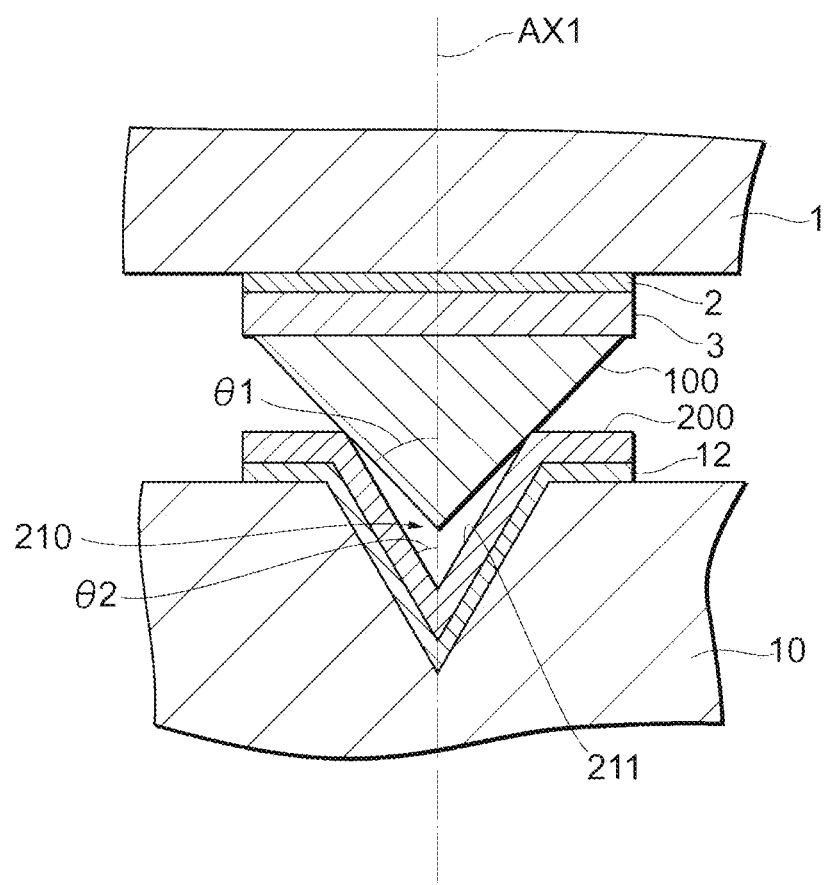
FIG. 9 is a cross-sectional view illustrating a method of manufacturing a semiconductor device according to a second embodiment of the present invention.

It should be noted that, the embodiments of the present invention are not limited to the above embodiment. For example, the shapes of the bump electrode 100 and the pad electrode 200, as shown in FIG. 9, are also encompassed in the scope of the embodiments of the present invention. Specifically, the bump electrode 100 may have a conical shape without the flat surface 101 formed at the tip end thereof and the pad electrode 200 may have the recess 210 formed in a pyramid shape without the flat surface 212 formed at the bottom thereof.

More specifically, FIG. 9 is a view illustrating a second embodiment of the present invention, which shows a state after the pressing step has been performed and before the ultrasonic joining step is started. As shown in FIG. 9, the bump electrode 100 according to the present embodiment has a complete conical shape without the flat surface 101 at the tip end thereof. The recess 210 of the pad electrode has a completely pyramidal shape without the flat surface 212 at the bottom thereof.

Assuming that the angle formed by the lateral surface 102 of the bump electrode 100 with respect to the central axis AX1 of the bump electrode 100 is a tilt angle $\theta 1$ and that the angle formed by the inner lateral surface 211 of the recess 210 with respect to the central axis (which coincides with AX1 in FIG. 9) of the recess 210 is a tilt angle $\theta 2$, the angle $\theta 1$ is larger than the angle $\theta 2$.

Figure 10:
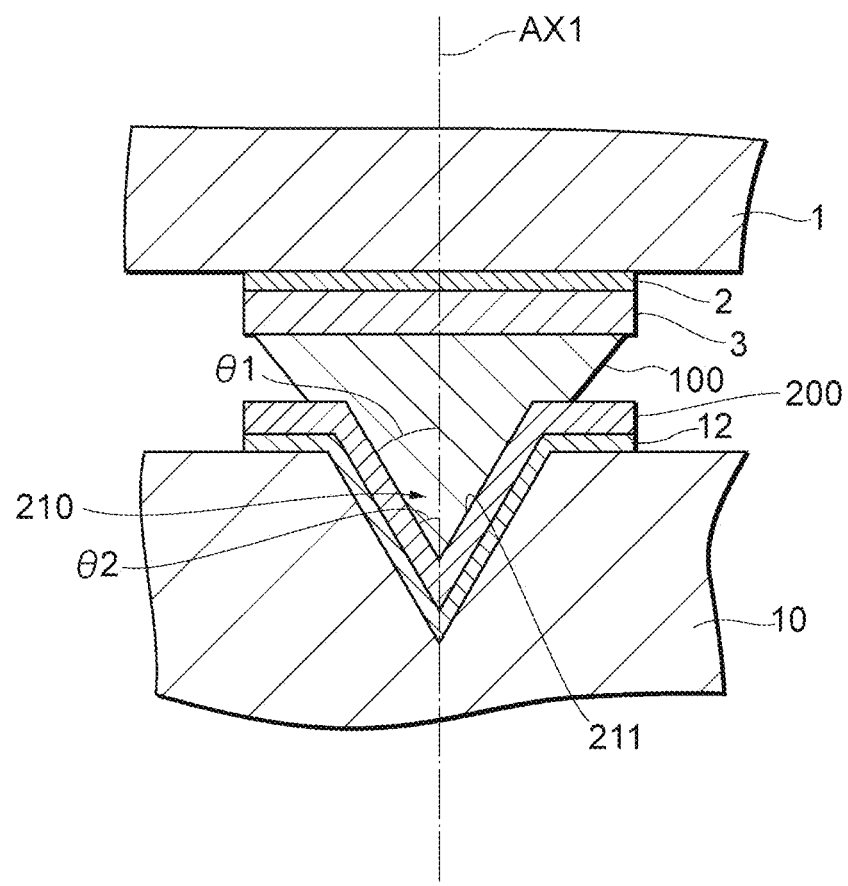
FIG. 10 is a cross-sectional view illustrating the shape, etc. of a bump electrode according to the second embodiment of the present invention.

FIG. 10 shows a state in which the ultrasonic joining step is performed from the state shown in FIG. 9 and the joining between the bump electrode 100 and the pad electrode 200 is completed. Before the ultrasonic joining step, there is a gap between the bump electrode 100 and the pad electrode 200 inside the recess 210. However, after the ultrasonic joining step, there is no longer such gap. The metallic bond is formed across substantially the entire contracting surface between the bump electrode 100 and the pad electrode 200.

Although the present embodiment has described an example in which the bump electrodes 100 are formed on the semiconductor chip 1 and the pad electrodes 200 are formed on the substrate 10, the bump electrodes may alternatively be formed on the substrate 10 and the pad electrodes 200 may alternatively be formed on the semiconductor chip 1.

The inner surface of the recess 210 of the pad electrode 200 may define any polygonal pyramidal shape such as a substantially five-sided pyramidal shape. In such embodiments, it is also possible to achieve a semiconductor device capable of rigidly joining the electrodes on the semiconductor chip and the electrodes on the substrate, etc., while aligning them with a high degree of accuracy.

In addition, the inner surfaces of the recess 210 of the pad electrode 200 may define any prism shape such as a quadrangular prism shape. Specifically, the inner lateral surfaces 211 of the recess 210 may be formed perpendicular to the surface of the substrate 10.

Figure 11:
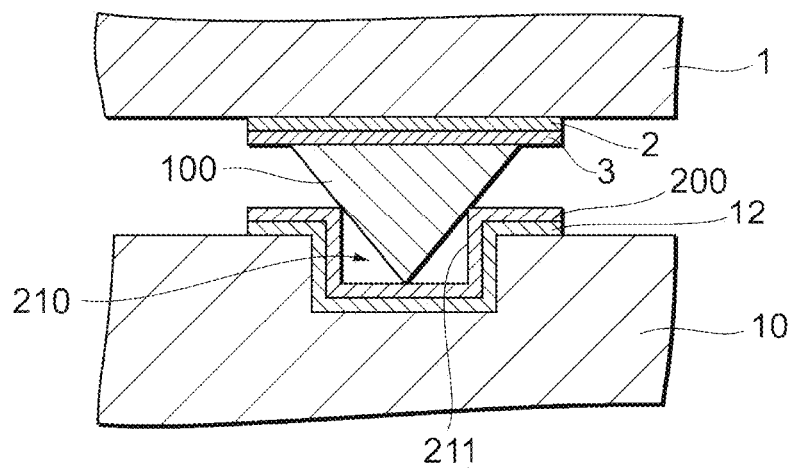
FIG. 11 is a cross-sectional view illustrating the shape, etc. of a bump electrode according to a third embodiment of the present invention.

More specifically, for example, FIG. 11 illustrates a third embodiment of the present invention. FIG. 11 shows a state after the pressing step has been performed and before the ultrasonic joining step is started. As shown in FIG. 11, the bump electrode 100 according to the present embodiment has a completely conical shape without the flat surface 101 at the tip end thereof. In addition, the inner lateral surfaces 211 of the recess 210 in the pad electrode 200 are formed perpendicular to the surface of the substrate 10. In other words, the inner lateral surfaces 211 define a quadrangular prism shape, not a pyramidal shape.

Figure 12:
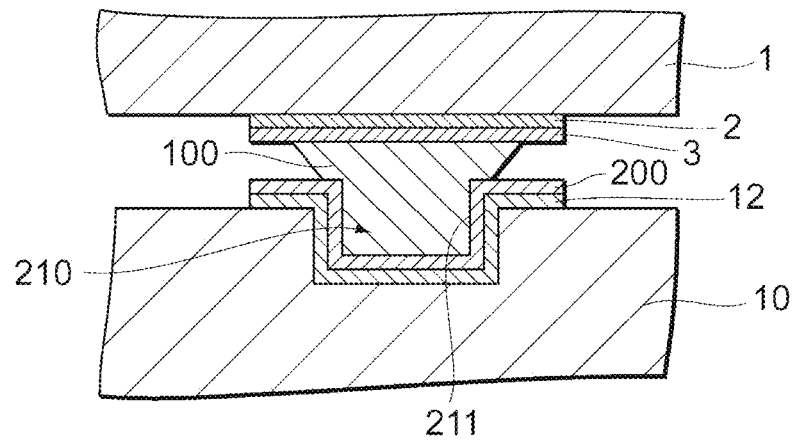
FIG. 12 is a cross-sectional view illustrating the shape, etc. of the bump electrode according to the third embodiment of the present invention.

FIG. 12 shows a state in which the ultrasonic joining step is performed from the state shown in FIG. 11 and the joining between the bump electrode 100 and the pad electrode 200 is completed. Before the ultrasonic joining step, there is a gap between the bump electrode 100 and the pad electrode 200 inside the recess 210. However, after the ultrasonic joining step, there is no longer such gap. The metallic bond is formed across substantially the entire contracting surface between the bump electrode 100 and the pad electrode 200.

Figure 13:
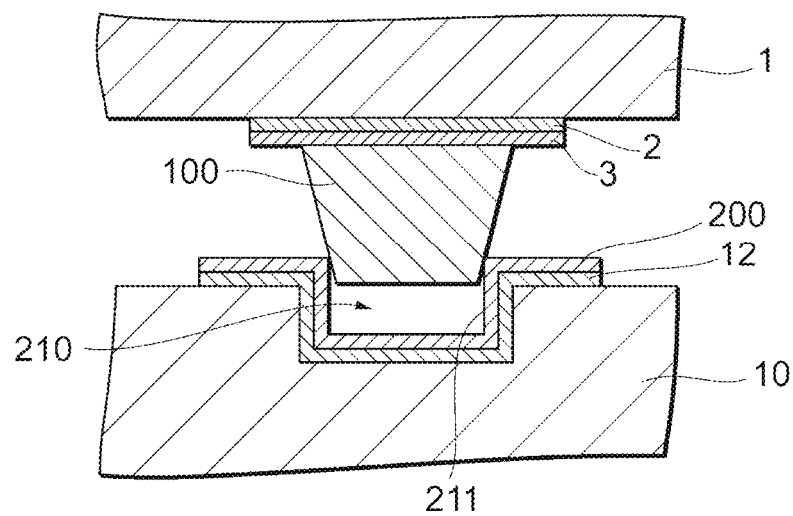
FIG. 13 is a cross-sectional view illustrating the shape, etc. of a bump electrode according to a fourth embodiment of the present invention.

FIG. 13 illustrates a fourth embodiment of the present invention. FIG. 13 shows a state after the pressing step has been performed and before the ultrasonic joining step is started. As shown in FIG. 13, the bump electrode 100 according to the present embodiment has the same shape as the bump electrode according to the first embodiment shown in FIG. 8, etc., i.e., a conical shape with the flat surface 101 formed at the tip end thereof. The inner lateral surfaces 211 of the recess 210 of the pad electrode 200 are formed perpendicular to the surface of the substrate 10. In other words, the inner lateral surfaces 211 define a quadrangular prism shape, not a pyramidal shape.

Figure 14:
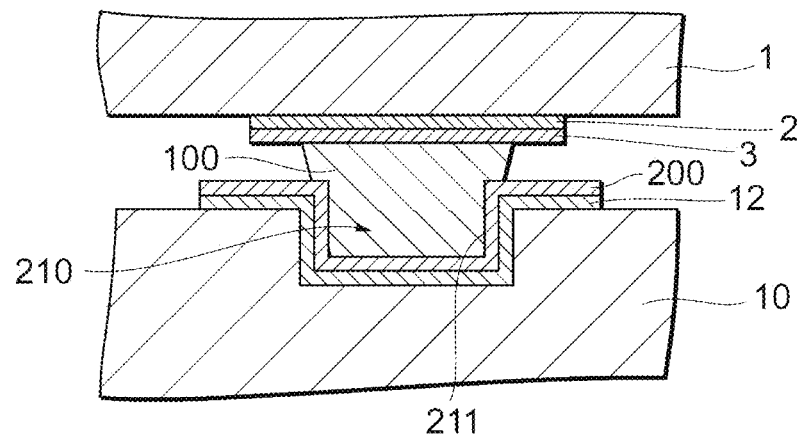
FIG. 14 is a cross-sectional view illustrating the shape, etc. of the bump electrode according to the fourth embodiment of the present invention.

FIG. 14 shows a state in which the ultrasonic joining step is performed from the state shown in FIG. 13 and the joining between the bump electrode 100 and the pad electrode 200 is completed. Before the ultrasonic joining step, there is a gap between the bump electrode 100 and the pad electrode 200 inside the recess 210. However, after the ultrasonic joining step, there is no longer such gap. The metallic bond is formed across substantially the entire contracting surface between the bump electrode 100 and the pad electrode 200.

As described above with reference to FIGS. 11-14, the advantageous effects of the present invention can be provided even when the tilt angle θ2 in FIGS. 8 and 9 is set to 0°.

The bump electrode 100 according to the first embodiment has a shape with a corner on the circumference of the flat surface 101 as shown in FIG. 3, etc. As is obvious from FIG. 6, this corner is first brought into contact with the inner lateral surfaces 211 of the recess 210 in the pressing step. The circumference of the flat surface 101 of the bump electrode 100 is crushed relatively significantly. As a result, the portion of the bump electrode 100 which has been crushed and deformed may possibly extend out of the recess 210 in the pressing step and the ultrasonic step.

Figure 15:
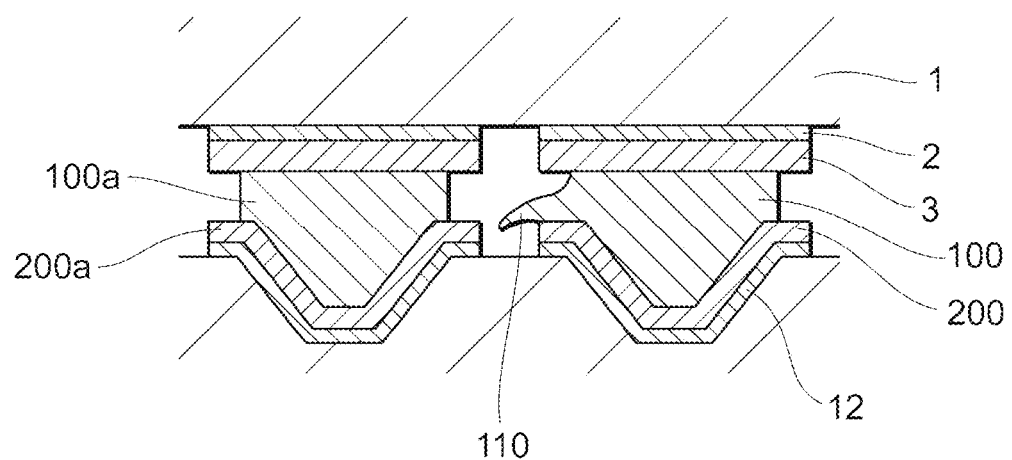
FIG. 15 is a diagram illustrating problems which arise when electrodes of a semiconductor chip are arranged with a fine pitch.

FIG. 15 shows a state after the ultrasonic step has been completed, which schematically shows a state in which the crushed portion of the bump electrode 100 extends out of the recess 210 as mentioned above. As shown in FIG. 15, the crushing and deformation of the bump electrode 100 as mentioned above forms a protruding part 110 which extends outside the recess 210. The protruding part 110 extends toward an adjacent bump electrode (denoted by 100*a*) and an adjacent pad electrode (denoted by 200*a*).

Consequently, when the semiconductor chip 1 is a fine-pitch chip (when the distance between adjacent bump electrodes 100 is short), the protruding part 110 might contact with the bump electrode 100*a* or the pad electrode 200*a*. In other words, electricity will be conducted through the adjacent electrodes, which may cause damage in or malfunctioning of the semiconductor chip 1.

Figure 16:
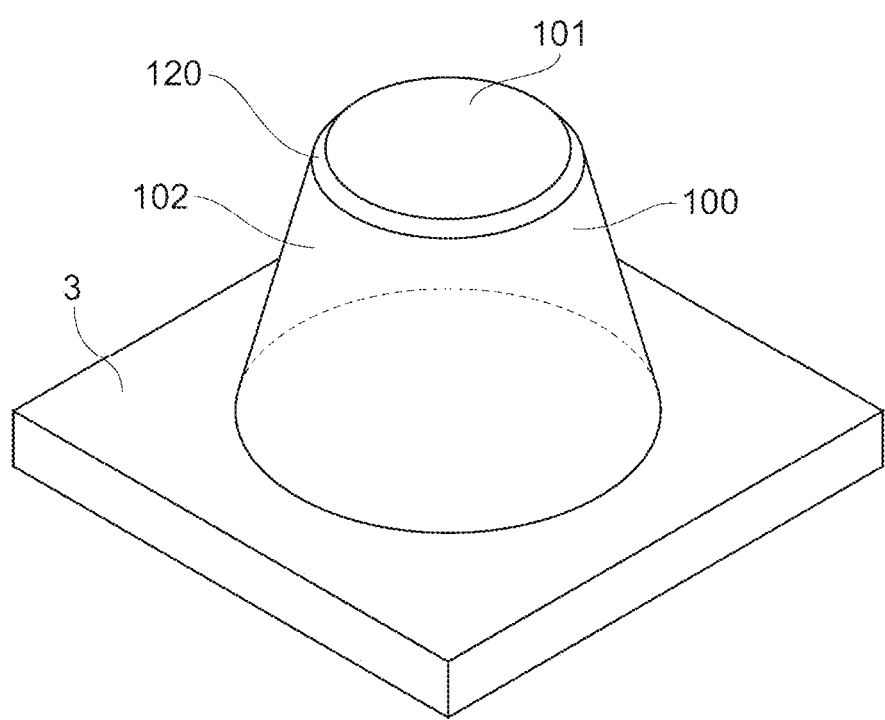
FIG. 16 is a cross-sectional view illustrating the shape, etc. of a bump electrode according to a fifth embodiment of the present invention.

In order to prevent such phenomenon, the circumference of the tip end (the flat surface 101) of the bump electrode 100 is preferably chamfered. FIG. 16 shows the bump electrode 100 according to a fifth embodiment of the present invention. As shown in FIG. 16, in the bump electrode 100 according to the present embodiment, the circumference of the flat surface 101 is chamfered and this chamfering forms a C surface 120. In the present embodiment, the shape of the pad electrode 200 is the same as that of the first embodiment (see FIG. 2, etc.)

Figure 17:
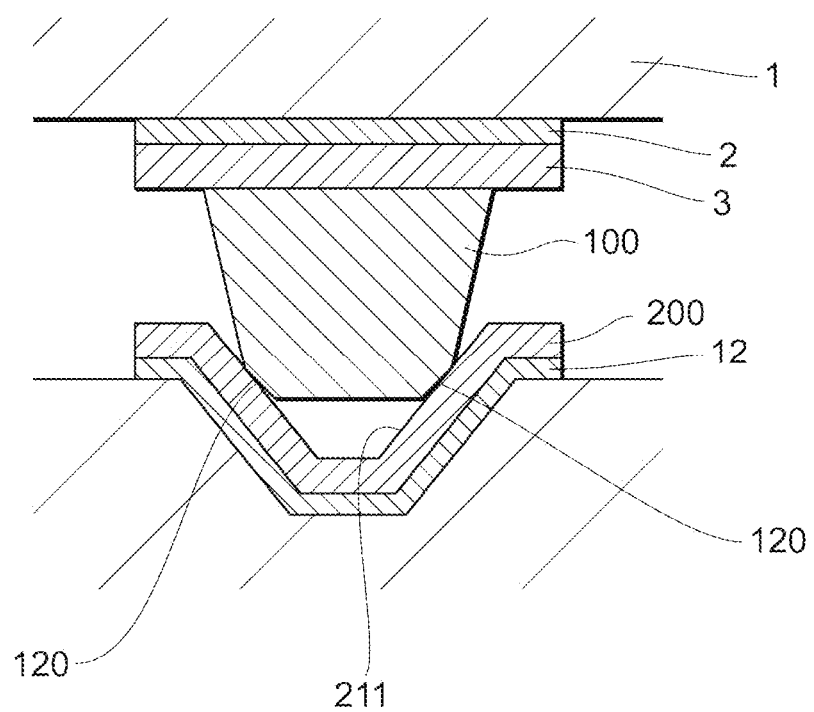
FIG. 17 is a cross-sectional view illustrating the shape, etc. of the bump electrode according to the fifth embodiment of the present invention.

FIG. 17 shows a step of joining the bump electrode 100 and the pad electrode 200 shown in FIG. 16 and schematically shows a state immediately before the process of shifting from the pressing step to the ultrasonic joining step. In the bump electrode 100, the C surface 120 is formed on the portions that first contact with the inner lateral surfaces 211 of the pad electrode 200. This can suppress the bump electrode 100 from being significantly crushed during the pressing step and the ultrasonic joining step, which can consequently suppress the crushed bump electrode 100 from extending out of the recess 210. In other words, the formation of the protruding part 110 shown in FIG. 15 is suppressed. Accordingly, even if the semiconductor chip 1 is a fine-pitch chip, it is possible to securely prevent electricity from being conducted through the adjacent electrodes.

In each of the embodiments described above, the pad electrode 200 is formed by etching a part of the surface of the substrate 10 made of silicon. In other words, the recess is formed directly in the surface of the substrate 10. However, although such formation method can be employed for the substrate 10 made of silicon, it is not easy to form recesses directly in the surface of the substrate 10 if the material of the substrate 10 is not silicon.

In such case, the pad electrode 200 having the recess 210 can be formed so that the entire, or substantially the entire, pad electrode 200 protrudes from the flat surface of the substrate 10. The following description describes a sixth embodiment of the present invention as an example of the pad electrode 200 formed by such method.

Figure 18:
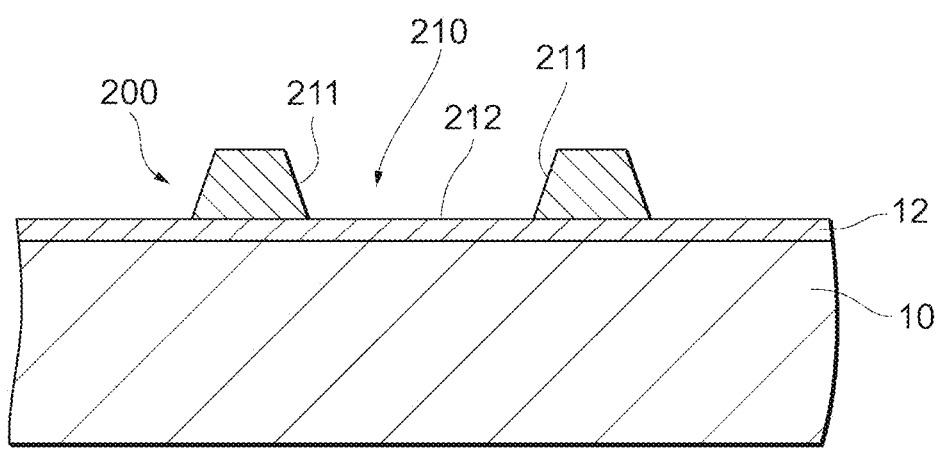
FIG. 18 is a cross-sectional view illustrating the shape, etc. of pad electrodes according to a sixth embodiment of the present invention.
Figure 19:
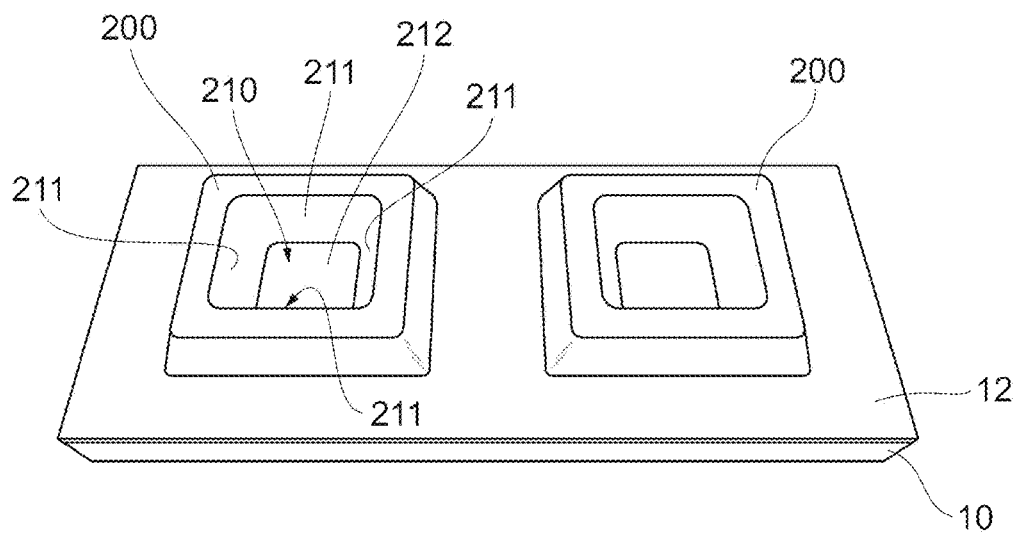
FIG. 19 is a perspective view showing the appearance of the pad electrodes according to the sixth embodiment of the present invention.

FIG. 18 is a cross-sectional view illustrating the shape of pad electrodes 200 according to the sixth embodiment of the present invention. FIG. 19 is a perspective view showing the appearance of the pad electrodes 200 according to the sixth embodiment of the present invention. In the present embodiment, as shown in FIGS. 18 and 19, recesses are not formed in the top surface of the substrate 10, unlike the first embodiment shown in FIG. 2, etc., and the entire top surface is a flat surface. The pad electrode 200 is formed so as to entirely protrude from the flat surface of the substrate 10.

More specifically, only a circumferential part along a rectangular shape of the pad electrode 200 protrudes from the surface of the substrate 10, which consequently forms a recess 210 at the center thereof. Similarly to the pad electrode 200 according to the first embodiment shown in FIG. 4, four inner lateral surfaces 211 of the recess 210 are tilted downward toward the center of the recess 210 and a flat surface 212 is formed at the bottom thereof. The flat surface 212 in the present embodiment is an insulating layer 12 formed on the surface of the substrate 10.

Figure 20:
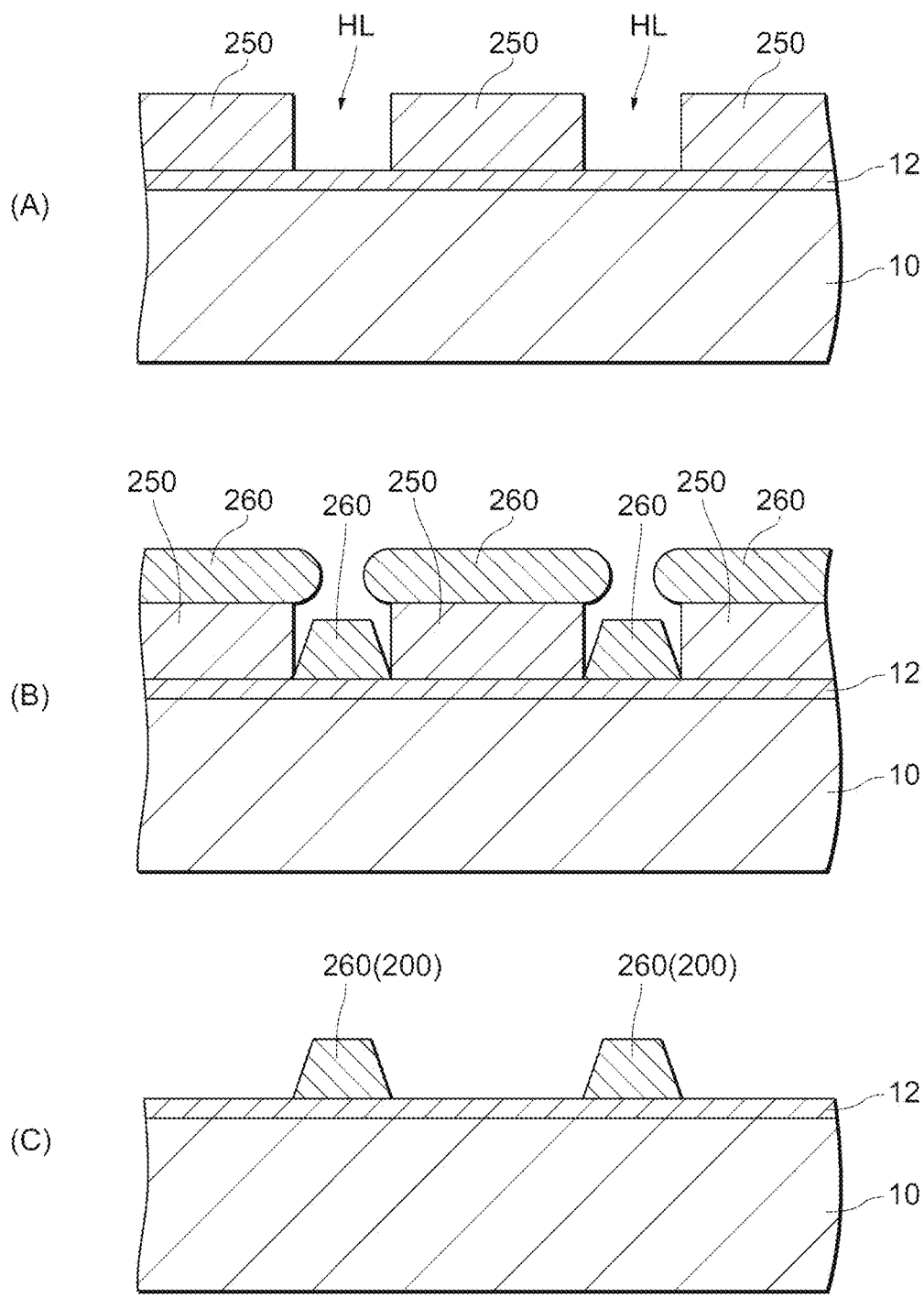
FIG. 20 shows cross-sectional views illustrating a method of manufacturing the pad electrodes according to the sixth embodiment of the present invention.

A method of forming the pad electrodes 200 shown in FIGS. 18 and 19 will now be described below with reference to FIG. 20.

First, as shown in FIG. 20(A), the insulating layer 12 made of $SiO_2$ is formed at a position, which is to be located below the pad electrodes 200, on the top surface of the substrate 10. Then, masking 250 is applied on the entire top surface of the insulating layer 12 and rectangular holes HL are formed at positions where the pad electrodes 200 are to be formed, in the masking 250. In other words, only portions in which the pad electrodes 200 are to be formed in the surface of the insulating layer 12 are exposed. It should be noted that the masking 250 is left without being removed from the portions in which the recesses 210 are to be formed.

In this state, a metal layer 260 is formed using an NPD (Nano-Particles Deposition) method on the entire top surface of the substrate 10. As shown in FIG. 20(B), the metal layer 260 is formed on the top surface of the masking 250 and inside the holes HL.

The portions formed inside the holes HL (i.e., on the top surface of the insulating layer 12) in the metal layer 260 have a cross section that protrudes in a substantially trapezoidal shape from the insulating layer 12. These portions of the metal layer 260 will become the pad electrodes 200.

Then, as shown in FIG. 20(C), the masking 250 is removed from the top surface of the substrate 10. Only the portions formed inside the holes HL in the metal layer 260 are left unremoved. As a result, the pad electrodes 200 having the shapes shown in FIGS. 18 and 19 are formed.

It should be noted that the entire pad electrode 200 (metal layer 260) is formed of gold in the present embodiment. Alternatively, the pad electrode 200 may be formed of copper, instead of gold, and then gold coating may be applied to the entire surface thereof. The present invention can particularly exert its advantageous effects if at least the superficial layer of the pad electrode 200 is formed of a relatively soft metal such as gold.

The pad electrode 200 formed on the substrate 10 through the above steps has the recess 210 at the center thereof, as shown in FIG. 19. The four inner lateral surfaces 211 of the recess 210 are tilted downward toward the center of the recess 210 and the flat surface 212 is formed at the bottom. FIG. 21 shows photos showing the pad electrodes 200 that have actually been formed by the method described above. FIG. 21(A) is a photo of the pad electrodes 200 taken from obliquely above and FIG. 21(B) is a photo of the pad electrodes 200 taken from above (directly above).

The above method can form the pad electrode 200 on the surface of the substrate 10 without forming the recess in the substrate 10 itself, i.e., with the surface of the substrate 10 being kept flat. Accordingly, the pad electrode 200 having the recess 210 can be formed on the substrate 10 even when the material of the substrate 10 is not silicon.

Figure 22:
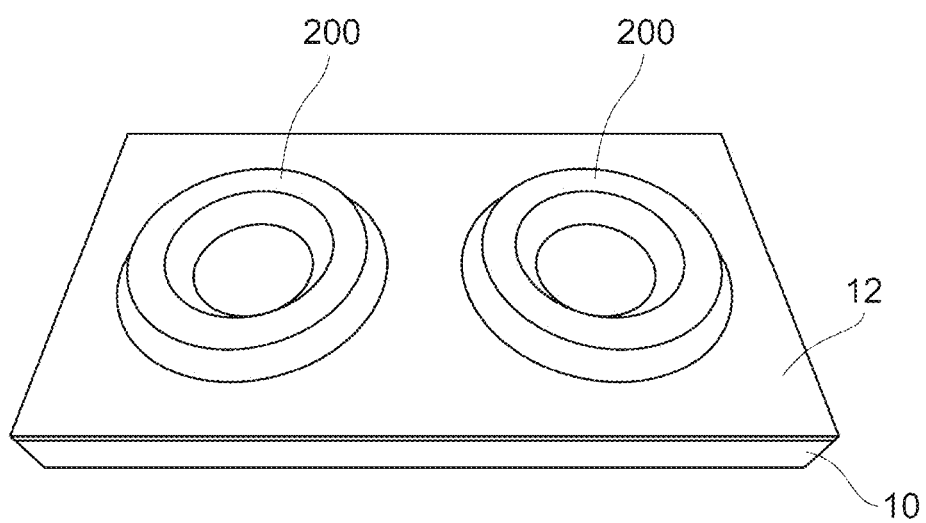
FIG. 22 is a perspective view showing the appearance of pad electrodes having a shape different from that of the pad electrodes in FIG. 19.

The shape of the pad electrode 200 formed by the above method is not limited to the substantially rectangular shape shown in FIG. 19. For example, the pad electrode 200 may have a ring shape, as shown in FIG. 22.

Figure 23:
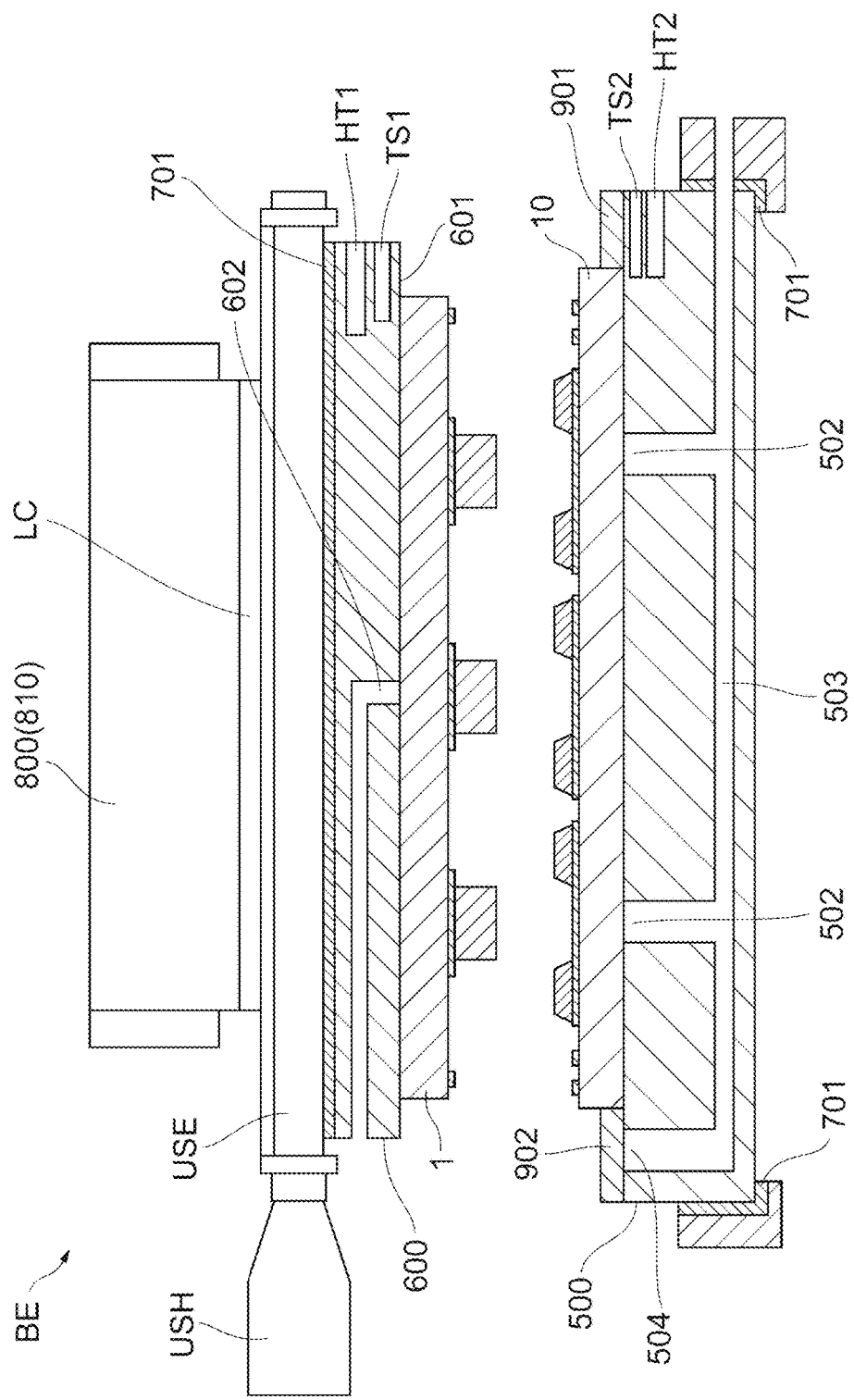
FIG. 23 is a diagram schematically showing the configuration of a semiconductor manufacturing apparatus according to the present invention.

Next, the specific configuration of the semiconductor manufacturing apparatus (joining apparatus BE) that has already been described with reference to FIG. 5, etc., will be further described in detail with reference to FIG. 23.

An ultrasonic apparatus USE is arranged on the upper surface side of the pickup apparatus 600, i.e., the opposite side of the holding surface 601 for adsorbing the semiconductor chip 1. The ultrasonic apparatus USE is an apparatus for applying ultrasonic vibration to the pickup apparatus 600 in the ultrasonic joining step.

The ultrasonic apparatus USE has a substantially flat plate-like shape and the ultrasonic apparatus USE is fixed to the pickup apparatus 600 in such a state that it abuts onto the entire upper surface of the pickup apparatus 600. A sheet-like heat insulating material 701 is disposed between the ultrasonic apparatus USE and the pickup apparatus 600. The heat insulating material 701 is provided for preventing heat from a heater HT1 (to be described later) being transferred from the pickup apparatus 600 to the ultrasonic apparatus USE. An ultrasonic horn USH serving as a source of ultrasonic vibration is arranged on a lateral side of the ultrasonic apparatus USE.

A movable part 810 of a cylinder apparatus 800 is arranged on the upper surface side of the ultrasonic apparatus USE. The cylinder apparatus 800 is an apparatus for moving the pickup apparatus 600 downward in order to apply pressure to between the semiconductor chip 1 and the substrate 10 during the pressing step. The upper surface of the ultrasonic apparatus USE is fixed to a lower end of the movable part 810.

A load cell LC is arranged between the ultrasonic apparatus USE and the movable part 810. The magnitude of a load which is to be applied to between the semiconductor chip 1 and the substrate 10 during the pressing step and the ultrasonic joining step can be detected by the load cell LC. During the pressing step and the ultrasonic joining step, the operation of the cylinder apparatus 800 is controlled based on the magnitude of the load detected by the load cell LC.

As already described earlier, the semiconductor chip 1 is moved parallel to the direction in which the central axis of the bump electrode 100 and the central axis of the recess 210 coincide with each other (in the horizontal direction) in the pressing step. A possible configuration for allowing such movement would be providing a mechanical play (backlash) so as to enable the movable part 810 to move easily along the horizontal direction. In such case, all of the movable part 810, the ultrasonic apparatus USE, the pickup apparatus 600 and the semiconductor 1 are integrally moved in the horizontal direction in the pressing step.

However, in the configuration of moving the semiconductor chip 1 using the mechanical play in the cylinder apparatus 800 may cause a situation in which the central axis of the bump electrode 100 and the central axis of the pad electrode 200 cannot coincide with each other. In general, it is not easy to accurately manage the range of a mechanical play, and the misalignment between the bump electrode 100 and the pad electrode 200 may not be able to be absorbed by the mechanical play, depending on the degree of misalignment at the start of the pressing step.

In order to address such problem, the joining apparatus BE employs a configuration in which the semiconductor chip 1 can be moved in the horizontal direction without depending on the mechanical play in the cylinder apparatus 800. Specifically, the magnitude of the vacuum adsorption force which is to be applied to between the semiconductor chip 1 and the pickup apparatus 600 is set to low so that the semiconductor chip 1 can be slid along the holding surface 601 of the pickup apparatus 600.

Thus, the semiconductor chip 1 can be slid without depending on the mechanical play, regardless of how large the misalignment between the bump electrode 100 and the pad electrode 200 is, which makes it possible to allow the central axis of the bump electrode 100 and the central axis of the pad electrode 200 to coincide with each other.

It should be noted that, if the magnitude of the vacuum adsorption force which is to be applied to between the semiconductor chip 1 and the pickup apparatus 600 is set at a too low level, the ultrasonic vibration of the ultrasonic apparatus USE might not be sufficiently transferred to the semiconductor chip 1. Thus, the magnitude of the vacuum adsorption force should be adjusted so as to satisfy both the conditions that: the semiconductor chip 1 can be easily moved; and sufficient ultrasonic vibration is transferred to the semiconductor chip.

A plurality of adsorption holes 502 is formed on an upper surface of the stage 500, i.e., a surface on which the substrate 10 is to be loaded. Each of the adsorption holes 502 communicates with an evacuation path 503 formed inside the stage 500. By evacuating the air which is present between the stage 500 and the substrate 10 through the adsorption holes 502 and the evacuation path 503, the substrate 10 can be fixed by vacuum adsorption.

On the upper surface of the stage 500, holding plates 901 and 902 are arranged around the substrate 10. The holding plate 901 is a plate that is fixed to the upper surface of the stage 500. The holding plate 902 is a plate that is fixed to the upper surface of the stage 500 by vacuum adsorption. In the stage 500, an adsorption hole 504 which communicates with the evacuation path 503 is formed below the holding plate 902.

These two holding plates 901 and 902 abut against the lateral surfaces of the substrate 10. Thus, the substrate 10 is fixed to the stage 500 by vacuum adsorption and, in addition, is held by the holding plates 901 and 902 at the lateral surfaces thereof. This consequently suppresses the substrate 10 from sliding along the upper surface of the stage 500.

As already described earlier, the joining apparatus BE is capable of joining the semiconductor chip 1 and the substrate 10 without heating the same. However, needless to say, the joining apparatus BE may also join the semiconductor chip 1 and the substrate 10 while heating the same. In the joining apparatus BE, the heater HT1 and a temperature sensor TS1 are embedded in the pickup apparatus 600. A heater HT2 and a temperature sensor TS2 are also embedded in the stage 500.

Depending on the size of the semiconductor chip 1 and the material, number, etc. of the bump electrodes 100, it may be desirable to heat the semiconductor chip 1 and the substrate 10 by controlling their temperatures using the heaters HT1 and HT2 in an auxiliary manner. With such configuration, it is possible for the semiconductor chip 1 and the substrate 10 to be joined more securely.

Embodiments of the present invention have been described with reference to some specific examples. However, the present invention is not limited to such specific examples. Specifically, design modifications that are appropriately added to such specific examples by a person skilled in the art are also encompassed in the scope of the present invention, as long as the design modification still has the features of the present invention. For example, the above-mentioned arrangement, materials, condition, shape, size and so on of each component in each specific example are not limited to those indicated in the specific examples and may be changed appropriately. In addition, components in each of the embodiments above may be combined, as long as the combinations are technically possible, and such combinations are also encompassed in the scope of the present invention as long as they have the features of the present invention.

DESCRIPTION OF REFERENCE NUMERALS

1: semiconductor chip
2: insulating layer
3: metal layer
4, 14: alignment mark
10: substrate
12: insulating layer
100, 100a: bump electrode
101: flat surface
110: protruding part
102: lateral surface
120: C surface
200, 200a: pad electrode
210: recess
211: inner lateral surface
212: flat surface
250: masking
260: metal layer
BE: joining apparatus
500: stage
502, 504: adsorption hole
503: evacuation path
510: window
600: pickup apparatus
601: holding surface
602: adsorption hole
701: heat insulating material
800: cylinder apparatus
810: movable part
901, 902: holding plate
AX1: central axis
D1, D2: diameter
LN1, LN2: dashed line
$\theta_1, \theta_2$: tilt angle
HL: hole
HT1, HT2: heater
LC: load cell
TS1, TS2: temperature sensor
USE: ultrasonic apparatus
USH: ultrasonic horn

What is claimed is:

1. A method of manufacturing a semiconductor device which is formed by connecting a semiconductor chip and a substrate or connecting semiconductor chips, the method comprising:
   a bump forming step of forming a first electrode on one semiconductor chip or substrate, the first electrode protruding in a substantially conical shape;
   a pad forming step of forming a second electrode on the other semiconductor chip or substrate, the second electrode having a recess with inner lateral surfaces thereof defining a substantially pyramidal shape or a prism shape;
   a pressing step of pressing the first electrode and the second electrode in a direction which brings them closer to each other, with the first electrode being inserted in the recess of the second electrode so that a central axis of the first electrode and a central axis of the recess coincide with each other; and an ultrasonic joining step of joining the first electrode and the second electrode by vibrating at least one of the first electrode and the second electrode using ultrasonic waves, wherein:

a first flat surface is formed at a tip end of the first electrode; and a first angle formed by a lateral surface of the first electrode relative to the central axis of the first electrode is smaller than a second angle formed by an inner lateral surface of the recess relative to the central axis of the recess of the second electrode.

2. The method according to claim 1, wherein a second flat surface is formed at a bottom of the second electrode.

3. The method according to claim 2, wherein a diameter of a circle inscribed with a circumference of the second flat surface is smaller than a diameter of a circumference of the first flat surface.

4. The method according to claim 1, wherein at least surfaces of the first electrode and the second electrode are formed of gold.

5. The method according to claim 4, wherein the first electrode and the second electrode are formed of copper whose surface is coated with gold.

6. The method according to claim 1, wherein at least surfaces of the first electrode and the second electrode are formed of copper.

7. The method according to claim 1, wherein a circumference of a tip end of the first electrode is chamfered.

8. The method according to claim 1, wherein the second electrode formed in the pad forming step is formed so as to protrude from a flat surface of the semiconductor chip or the substrate.

9. A method of manufacturing a semiconductor device which is formed by connecting a semiconductor chip and a substrate or connecting semiconductor chips, the method comprising:

a bump forming step of forming a first electrode on one semiconductor chip or substrate, the first electrode protruding in a substantially conical shape;

a pad forming step of forming a second electrode on the other semiconductor chip or substrate, the second electrode having a recess with inner lateral surfaces thereof defining a substantially pyramidal shape or a prism shape;

a pressing step of pressing the first electrode and the second electrode in a direction which brings them closer to each other, with the first electrode being inserted in the recess of the second electrode so that a central axis of the first electrode and a central axis of the recess coincide with each other; and an ultrasonic joining step of joining the first electrode and the second electrode by vibrating at least one of the first electrode and the second electrode using ultrasonic waves, wherein:

a first angle formed by a lateral surface of the first electrode relative to the central axis of the first electrode is smaller than a second angle formed by an inner lateral surface of the recess relative to the central axis of the recess of the second electrode.

10. The method according to claim 9, wherein at least surfaces of the first electrode and the second electrode are formed of gold.

11. The method according to claim 10, wherein the first electrode and the second electrode are formed of copper whose surface is coated with gold.

12. The method according to claim 9, wherein at least surfaces of the first electrode and the second electrode are formed of copper.

13. The method according to claim 9, wherein a circumference of a tip end of the first electrode is chamfered.

14. The method according to claim 9, wherein the second electrode formed in the pad forming step is formed so as to protrude from a flat surface of the semiconductor chip or the substrate.

* * * * *

UNITED STATES PATENT AND TRADEMARK OFFICE
CERTIFICATE OF CORRECTION

PATENT NO. : 9,627,347 B2  Page 1 of 1
APPLICATION NO. : 14/428635
DATED : April 18, 2017
INVENTOR(S) : Masahiro Aoyagi et al.

It is certified that error appears in the above-identified patent and that said Letters Patent is hereby corrected as shown below:

In the Claims

Column 19, Line 17, Claim 3, after "claim" delete "2" and insert -- 1 --.

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*